United States Patent
Dameron et al.

(10) Patent No.: US 12,252,452 B2
(45) Date of Patent: Mar. 18, 2025

(54) COATINGS ON PARTICLES OF HIGH ENERGY MATERIALS AND METHODS OF FORMING SAME

(71) Applicant: Forge Nano Inc., Thornton, CO (US)

(72) Inventors: Arrelaine Dameron, Boulder, CO (US); Ryon Tracy, Westminster, CO (US); Jessica Burger, Thornton, CO (US); Chris Gump, Louisville, CO (US); Andrew Broerman, Frederick, CO (US)

(73) Assignee: Forge Nano, Inc., Thornton, CO (US)

( * ) Notice: Subject to any disclaimer, the term of this patent is extended or adjusted under 35 U.S.C. 154(b) by 0 days.

(21) Appl. No.: 18/421,700

(22) Filed: Jan. 24, 2024

(65) Prior Publication Data

US 2024/0228401 A1    Jul. 11, 2024

Related U.S. Application Data

(62) Division of application No. 17/096,893, filed on Nov. 12, 2020, now Pat. No. 11,976,016.

(60) Provisional application No. 62/934,479, filed on Nov. 12, 2019.

(51) Int. Cl.
C06B 45/00     (2006.01)
C06B 21/00     (2006.01)
C06B 45/30     (2006.01)

(52) U.S. Cl.
CPC .......... *C06B 45/30* (2013.01); *C06B 21/0083* (2013.01)

(58) Field of Classification Search
CPC ...... C06B 45/30; C06B 21/0083; C06B 45/00
USPC .............................................................. 149/5
See application file for complete search history.

(56) References Cited

U.S. PATENT DOCUMENTS

| | | | |
|---|---|---|---|
| 4,058,430 A | 11/1977 | Suntola et al. | |
| 8,202,367 B2 | 6/2012 | Tachibana et al. | |
| 8,323,988 B2 | 12/2012 | Ahn et al. | |
| 9,284,643 B2 | 3/2016 | King et al. | |
| 9,443,998 B2 | 9/2016 | Werner et al. | |
| 9,845,532 B2 | 12/2017 | Van Ommen | |
| 11,066,746 B1 | 7/2021 | Miyamoto | |
| 2004/0079286 A1 | 4/2004 | Lindfors | |
| 2011/0027457 A1 | 2/2011 | Woodcock | |

(Continued)

FOREIGN PATENT DOCUMENTS

| | | |
|---|---|---|
| CN | 109103428 A | 12/2018 |
| KR | 102088368 B1 | 3/2020 |

OTHER PUBLICATIONS

International Preliminary Report on Patentability from International Application No. PCT/US2020/060306 dated May 17, 2022.

(Continued)

*Primary Examiner* — James E McDonough
(74) *Attorney, Agent, or Firm* — Frank Rosenberg

(57) ABSTRACT

The present invention relates to the field of coatings on high-energy materials, devices or products that comprise the coated high-energy materials, functional coating materials and methods for producing and using the same. In particular, the present invention relates to energetic materials having initiated release coatings to improve the performance and shelf-life of the devices, products and/or raw materials, suitable for use as energetics or propellants for munitions, rockets, pyrotechnics, flares or other devices or components.

8 Claims, 7 Drawing Sheets

(56) References Cited

U.S. PATENT DOCUMENTS

| | | | |
|---|---|---|---|
| 2014/0264196 A1* | 9/2014 | Werner | C23C 16/30 |
| | | | 977/774 |
| 2017/0145565 A1 | 5/2017 | Elam | |
| 2019/0062914 A1 | 2/2019 | King | |
| 2019/0216742 A1* | 7/2019 | Neikirk | A61K 31/424 |
| 2020/0274138 A1 | 8/2020 | Weimer | |
| 2020/0299837 A1 | 9/2020 | Woelk et al. | |

OTHER PUBLICATIONS

International Search Report and Written Opinion from International Application No. PCT/US2020/060306, mailed Jul. 22, 2021.
Invitation to Pay Additional Fees with Partial International Search and Written Opinion from International Application No. PCT/US2020/060306, mailed May 18, 2021.
Chen et al. (2017) "Lithium metal protected by atomic layer deposition metal oxide for high performance anodes", Journal of Materials Chemistry A, 5(24), 12297-12309.
Fotou, G. P., & Kodas, T. T. (1997) "Sequential gas-phase formation of Al2O3 and SiO2 layers on aerosol-made TiO2 Particles", Advanced Materials, 9(5), 420-423.
Machine translation of description of KR 102088368 B1, (2019).
Machine translation of description of CN 109103428 A, (2018).

* cited by examiner

------ 200120_AlLi_ramp_T446a.001
——— 200120_AlLi_ramp_Neat_1.001
········ 200120_AlLi_ramp_T447a.004

---------- 200123a_AlLi_45c hold_T446a_3hr.001
— — — 200123_AlLi_45c hold_T446a_3hr.001
——— 200122_AlLi_45c hold_T446a.001
------ 200123_Al_H5_45c hold_18hr.001
········ 200120_AlLi_Hold_T446a.001
——— 200120_AlLi_Hold_Neat2.001

COATINGS ON PARTICLES OF HIGH ENERGY MATERIALS AND METHODS OF FORMING SAME

This application is a division of U.S. Non-Provisional patent application Ser. No. 17/096,893 filed 12 Nov. 2020 which claims the priority benefit of U.S. Provisional Patent Application Ser. No. 62/934,479 filed 12 Nov. 2019.

FIELD OF THE INVENTION

The present invention relates to the field of high-energy materials having functional coatings or encapsulating materials thereon, devices or products that comprise the coated high-energy materials, functional coating materials and methods for producing and using the same. In particular, the present invention relates to energetic materials having initiated release coatings to improve the performance and shelf-life of the devices, products and/or raw materials.

INTRODUCTION

The incorporation of particles from millimeter-scale down to nanometers in size is ubiquitous in end-use products produced in industrial-scale quantities. Many industries are finding that the particles used can benefit from surfaces that are coated with a shell, layer, film, or other coating, ranging from sub-nanometer to hundreds of micrometers in thickness. For a variety of reasons, each sector or industry has determined that the incorporation of coated particles into the end-use product provides enough value, e.g., in the form of enhanced performance of the product, that the cost associated with each coating process is justified. The field of energetic materials has been identified as one in which nanoscale coatings can significantly improve the uniformity and compatibility of surfaces, preventing the premature interaction between fuel and oxidizer materials, and furthermore providing a triggerable release mechanism to enhance the control over intentionally driving such an interaction or reaction. There are many fields of use and devices that can be improved by using such materials, including both military and non-military applications.

Energetic materials are able to undergo exothermic reactions rapidly and are typically chemical compounds or mixtures or substances in a metastable state. Examples of energetic materials and devices include primary and secondary explosives, propellant or propulsion charges, rockets and their fuels, other types of devices and their fuels, pyrotechnics, flares, detonatable devices such as air bags, smoke and fog generators, illuminants or obscurants, etc. Energetic materials can be initiated using electrostatic, thermal, mechanical or similar stimulus, and coating materials can be interposed between reactants, and/or applied to the surfaces of combustible materials. Examples of common singular and multi-component materials found in propellants include: gun powder, charcoal, nitrates, sulfur and/or sulfates, perchlorates, HMX, NG, TNT, hydrazine, organometallics, metals and metal alloys including aluminum, zinc, magnesium, Group I and Group II metals, monometallic or multi-metallic hydrides, transition metals, metalloids, alloys thereof, and so on. Many energetic materials have a critical parameter as activation/total energy, integrated device temperature, optical color/brightness, etc., where certain conventional types of coatings adversely affect such critical parameter. New coatings, methods and combinations thereof are required to provide initiated release coatings that do not adversely impact the end-use properties of the materials, and/or the devices or systems that comprise the materials.

Methods of producing compositionally-tailored layers using additive, layer-by-layer controlled techniques, even those as precise as Atomic Layer Epitaxy or Atomic Layer Deposition as described by Suntola et al. (U.S. Pat. No. 4,058,430), have been deployed to achieve an array of effects (see, for example, Ahn, et al., U.S. Patent Application Publication No. 2011/0275163). In addition, techniques that cast or otherwise form a bulk layer consisting of a plurality of compositionally-tailored coated particles for dielectric and other unrelated fields have also been described. There is minimal literature that relates to applying such coatings onto highly-energetic materials due to the potential incompatibility between exothermic surface reactions and materials that can be triggered or otherwise activated for an exothermic release event. Many types of coatings have been unattainable using techniques taught by the prior art, for which the present invention overcomes.

As described by King et al. (U.S. Patent Application Publication Nos. 2011/0236575 and 2019/0062914), vapor deposition processes are usually operated batch-wise in reaction vessels such as fluidized bed reactors, rotary reactors and V-blenders, amongst others. Batch processes have significant inefficiencies when operated at large scale. One of the disadvantages of batch processes is that the reactor throughput is a function of the total particle mass or volume loaded into a certain sized vessel for a given process, the total process time (up-time), and the total time between processes (down-time) to load, unload, clean, prepare, etc. In addition, batch processes incur large down-times because at the end of each batch the finished product must be removed from the reaction equipment and fresh starting materials must be charged to the equipment before the subsequent batch can be produced. Equipment failures and maintenance add to this downtime in batch processes.

Moreover, batch process equipment tends to be very large and expensive. The need to operate these processes under vacuum adds greatly to equipment costs, especially as equipment size increases. Because of this, equipment costs for batch processes tend to increase faster than operating capacity.

Another problem that occurs as the process equipment becomes larger is that it becomes more difficult to maintain uniform reaction conditions throughout the vessel. For example, temperatures can vary considerably within a large reaction vessel. It is also difficult to adequately fluidize a large mass of particles, specifically nanoparticles. Issues such as these can lead to inconsistencies and defects in the coated product. With respect to energetic materials, inconsistent reaction conditions can lead to uncontrolled or runaway type events that create substantial safety risks, and additional in-situ monitoring techniques are required to ensure proper application of upgrading coating or encapsulating materials.

In vapor deposition processes such as ALD and Molecular Layer Deposition (MLD), the particles are contacted with two or more different reactants in a sequential manner. This reduces the likelihood that autothermal events during high energy material coating processes will occur, but represents yet another problem for a batch operation. For a traditional batch process, all cycles are performed sequentially in a single reaction vessel. The batch particle ALD process incurs additional down-time due to more frequent periodic cleaning requirements, and the reaction vessels cannot be used for multiple film types when cross-contamination could be problematic. In addition, the two sequential self-limiting reactions may occur at different temperatures, requiring heating or cooling of the reactor between cycle steps in order to accommodate each step.

The throughput for a batch process can be increased either by building larger reaction vessels and/or operating identical reaction vessels in parallel. The capital cost to counteract this down-time from a throughput perspective is to build a larger reaction vessel. With larger vessels, localized process conditions, including internal bed heating, pressure gradients, mechanical agitation to break up nanoparticle aggregates, and diffusion limitations amongst others, become more difficult to control.

Furthermore, there is a practical maximum reaction vessel size when performing ALD processes on fine and ultra-fine particles, which limits the throughput for a single batch reactor operating continually. In general, the time duration for the process of producing a given amount of coated materials equals the up-time plus down-time. There is also a practical maximum allowable in capital expense to fabricate an ALD-coated particle production facility, which effectively limits the number of batch reactors that can operate identical processes in parallel. With these and other constraints, there are practical throughput limitations that prohibit the integration of some particle ALD processes at the industrial scale.

King et al. discusses a high-rate "Spatial ALD" manufacturing process and apparatus for coating particles in semi-continuous fashion using an array of isolated vessels with counter-current gas-solids transport. As described in King et al., one example where a semi-continuous coated particle manufacturing process is desirable is a facility that utilizes particle ALD to produce fine or ultra-fine passivated titanium dioxide particles used as pigments in paints, plastics, paper, etc. Another example is a facility that utilizes particle ALD to produce coated fine or ultra-fine particles for cathodes, anodes, dielectrics, metals, polymers, semiconductors and other ceramics for integration into power systems devices including, but not limited to, batteries, capacitors, varistors, thyristors, inverters, transistors, light emitting diodes and phosphors, photovoltaic, and thermoelectric devices. Particle ALD produced powders for the pigment and power systems industries can significantly improve the performance of the end-use products, which can be cost competitive if produced at high annual throughputs. Van Ommen et al. (U.S. Patent Application Publication No. 20120009343) discusses another high-rate "Spatial ALD" process and apparatus to coat particles in a fully continuous co-current gas-solids transport scheme. Each of these methods has its own ascribed operating cost. These methods are suitable for the manufacture of particular coated particles. In addition, each of these methods is believed to be superior and economically more viable compared to traditional batch (or "temporal") ALD coating methods. Fotou et al. (Sequential Gas-Phase Formation of Al2O3 and SiO2 Layers on Aerosol-Made TiO2 Particles" Advanced Materials (1997), 9, No. 5, 420-423) discuss methods of producing nanocoatings on submicron particles by exposing reactive precursors to the surfaces of particles using continuous-flow Chemical Vapor Deposition techniques. However, the consistency, uniformity and thickness do not lend themselves easily to less than 5 nm coatings on submicron-sized particles. Accordingly, there is a need for thin film coated energetic material particles of all sizes and methods and systems for producing and using the same in an array of end-use military and civilian products.

SUMMARY OF THE INVENTION

It has been discovered that particular processing steps (or classes thereof) taught herein to apply thin film coatings (e.g., generally 5 nm or less, but not limited thereto) on energetic materials can lead to controllable, safe and effective composite materials demonstrating protection from degradation, and an ability to tune or tailor the functionality and mechanism of the initiation of devices or systems comprising the materials, without adversely impacting the core properties of the materials. Some aspects of the invention provide a means to incorporate highly-energetic materials having high surface areas due to the passive, precise and triggerable coatings on material surfaces. An embodiment of a highly-energetic material coated with a tailored, functional protective layer as described herein can provide one or more of: 1) improved stability (and therefore performance) of propellant materials or devices comprising energetic materials for long shelf life, as for example what is required for rockets and missiles, by mitigating air/moisture (or other environmental factor) reactivity and providing a homogeneous, reproducible, controlled and tunable passivation layer; 2) modulating the powder rheology to improve mixing and packing, improving the overall energetic material packing density or uniformity within the system or device; this can allow for existing devices to travel further, operate longer, or similar spatial or temporal vector/metric, without having to redesign the system or device around a new cartridge, fuel, or energetic material housing/delivery system; 3) increased fuel oxidizer contact by depositing the oxidizer on the fuel (or its converse) and or changing the wetting properties of the fuel/oxidizer/binder to impact the interface and relative loadings; 4) modulating or otherwise tuning the ignition temperature, activation energy, or energy (thermal, optical, chemical, etc.) release function with respect to time; and/or 5) increasing the temperature of interparticle sintering or fusing to prevent in situ sputtering, or other catastrophic failure mechanism.

Conventional film deposition methods cannot make continuous, uniform films on high surface area substrates like ALD can, and conventional ALD processes taught by the prior art have been found to be insufficient.

The thin film coating can be an oxidation-resistant material or a reliability-improving material. As used herein, the term "reliability-improving materials" refers to materials that can improve the performance and/or the life span or mean time to failure of the device or component compared to the same device or component in the absence of the thin film coating. In one particular instance, the reliability-improving materials increase the performance of the device or component by at least 10%, typically by at least 25%, and often by at least 100%. compared to the same device or component in the absence of the thin film coating. In another instance, the reliability-improving materials increase the mean time to failure of the device or component by at least 20%, typically by at least 50%, and often by at least 200% relative to the same device or component in the absence of the thin film coating.

In one aspect, the invention provides a composition, comprising: particles comprising a core comprising an AlLi alloy; a passivating coating disposed over the core; wherein the composition is characterizable by a humidity resistance such that, when held at 45° C. for 18 hours and exposed to a flow of Argon gas humidified by flowing through a water-filled bubbler at 13° C. and 10 psig, and passed over the surfaces of the particles, a TGA of the composition shows an increase in weight of 1.0% or less, preferably 0.5 wt % or less, more preferably 0.2 wt % or less; and further comprising one or more of the following characteristics: an elemental composition of at least 95% Al plus Li; or wherein the coating has a thickness of 10 nm or less (or 5 nm or less)

over at least 30% (or at least 50%, or at least 70%) of the surface area of the particle cores in the composition; or wherein the passivation coating comprises an oxide, nitride, halide or phosphate of a metal, metalloid or non-metal, and wherein the particles comprise a first interdiffusion layer that comprises 60-90% lithium or aluminum, a second interdiffusion layer that comprises 10-40% lithium or aluminum, or both.

In some embodiments, the invention can be additionally characterized by one or any combination of the following features: wherein the particles comprising a core and a passivating coating are mixed with particles of a solid oxidizer; wherein the solid oxidizer comprises a perchlorate; wherein the perchlorate comprises ammonium perchlorate; wherein, as compared with the uncoated particles, the particles possess an increased hydrolysis resistance by 10, 20, 50 or 100%, as measured by the TGA conditions mentioned above; wherein the passivation coating comprises at least 80 mass % silica and has an average thickness of 2 to 20 nanometers; wherein the passivation coating comprises at least 80% alumina and has a thickness of 2 to 20 nanometers wherein, as compared with the uncoated particles, the particles, when subjected to a ramping temperature of 20° C./min in an inert atmosphere, sinter at a temperature that within 50° C., or 30° C., or 20° C., of that of the uncoated particles; wherein the coated particles have a mass average particle size of 1000 nm or less, or 800 nm or less, or 500 nm or less, or 300 nm or less.

In another aspect, the invention provides a particle coating, comprising: wherein the coating is characterizable by a humidity resistance such that, when formed over a core that is metallic or semi-metallic and comprises hydrogen and/or an alkali or alkaline earth element, and when held at 45° C. for 18 hours and exposed to a flow of Argon gas humidified by flowing through a water-filled bubbler at 13° C. and 10 psig, and passed over the surfaces of the particles, a TGA of the composition shows an increase in weight of 1.0% or less, preferably 0.5 wt % or less, more preferably 0.2 wt % or less; wherein a TGA of the uncoated core particle under the same conditions would exhibit an increase in weight of greater than 1.0% and further comprising one or more of the following characteristics: wherein the coating has a thickness of 10 nm or less (or 5 nm or less) over at least 30% (or at least 50%, or at least 70%) of the surface area of the particle cores in the composition; or wherein the coating comprises an oxide, nitride, halide or phosphate of a metal, metalloid or non-metal, and wherein the coating comprises a first interdiffusion layer that comprises 60-90% lithium or aluminum, a second interdiffusion layer that comprises 10-40% lithium or aluminum, or both.

In some embodiments, the invention can be additionally characterized by one or any combination of the following features: wherein the coating is present on at least 50%, 70%, 90% or at least 95% of the particles in a collection of at least 1 gram; wherein the coating comprises at least 80 mass % silica and has an average thickness of 2 to 20 nanometers; wherein the coating comprises at least 80% alumina and has a thickness of 2 to 20 nanometers; wherein the coating is formed over a core of an aluminum metal alloy; wherein at least 50% or at least 70% or at least 90% of the coating, as measured in areas of 100 nm, has a variation of elements of 50% or less, or 20% or less where these elements are the present in at least 10% of the coating (i.e., not including minor contaminants) where this can be measured by a technique such as TEM/EDX; wherein the coating comprises at least 60% or at least 80% alumina, or at least 60% or at least 80% silica.

In a further aspect, the invention provides a method of making a coated particle, comprising: providing core particles having particle surfaces and moving the core particles to expose the particle surfaces in a first reaction chamber; first dosing the core particles with an amount of first precursor that is less than that required to fully saturate all the surfaces to form first coated particles; after the first dosing, evacuate or purge the first reaction chamber, and/or transport the first coated particles to a second reaction chamber; second dosing the first coated particles with an amount of first precursor that is less than that required to fully saturate all the surfaces on the core particles to form second coated particles in the first reaction chamber or the second reaction chamber; after the second dosing, evacuate or purge the reaction chamber used in the second dosing step; and third dosing the second coated particles with a second precursor wherein the second precursor reacts with the coated particles to form a passivation coating on the core particles. There is no step of reacting with a second precursor between the first dosing and the second dosing, in other words the first dosing of the first precursor is applied to the particles and then this material is subjected to another dosing of the first precursor; the precursor that deposits on the particle surface is not reacted with a second precursor (this is unlike conventional ALD) and not subjected to additional treatments, instead additional first precursor is added in a second dosing.

In a related aspect, the invention provides a method for applying a coating to a highly-energetic powder material comprising at least one Group I or Group II element, comprising: a) providing a volume of powder having a surface area to a reactor chamber, providing a total volume of first reagent and a total volume of second reagent, wherein the total volume of first reagent and total volume of second reagent are sufficient to saturate 100% to 150% of the surface area of said volume of powder; b) bringing the reactor chamber to a temperature between 25° C. and 100° C.; c) exposing the volume of powder to between 12.5% and 50% of the total volume of first reagent over a first time period; d) flushing or purging the reactor chamber over a second time period that is between 20% and 400% of the first time period; e) repeating steps (c) and (d) until the total volume of first reagent is exposed to the volume of powder; f) exposing the volume of powder to between 12.5% and 50% of the total volume of second reagent over a third time period; g) flushing or purging the reactor chamber over a fourth time period that is between 20% and 400% of the third time period; and h) repeating steps (f) and (g) until the total volume of second reagent is exposed to the volume of powder.

The invention can be additionally characterized by one or any combination of the following features: wherein, in the third dosing, there is an amount of second precursor that is less than that required to fully saturate all the surfaces on the second coated particles; and after the third dosing, evacuate or purge the reaction chamber used in the third dosing step; further comprising a fourth dosing with an amount of second precursor that is less than that required to fully saturate all the surfaces on the second coated particles to form third coated particles; wherein the precursors are delivered to the reaction chamber with a sweep gas; wherein the temperature is maintained at 200° C. or less, or 100° C. or less throughout the dosings; wherein the process comprises several phases and, in the initial phase, the dosings are smaller than in a subsequent phase, for example where the earlier dosings of the first precursor are 50%, 40%, or 30% or less of that needed for saturation and subsequent dosings of the first precursor are greater than 50% or greater than 60% of saturation. The methods can be further characterized by any of the compositional or property descriptions herein.

In another aspect, the invention provides a system for vapor deposition, comprising: a precursor container; a precursor conduit connecting the precursor container and a charge cell; a valve disposed between the precursor container and the charge cell; optionally, a heater in thermal contact with the charge cell; a pressure gauge connected to the charge cell; a process gas stream conduit; a valve disposed between the charge cell and the process gas stream conduit; and the first reaction chamber connected to the process gas stream conduit such that, during operation, precursor gas from the charge cell passes from the charge cell to the reaction chamber. The system may include any of the materials or conditions described herein. The inventive methods also include the option to utilize this system.

In another aspect, the invention provides a system for vapor deposition further comprising: a scale; the precursor container resting on the scale; a flexible conduit providing a fluid connection between the precursor container and a process gas stream conduit; and wherein a valve is disposed between the flexible conduit and the process gas stream conduit. The system may include any of the materials or conditions described herein. The inventive methods also include the option to utilize this system.

Any of the inventive aspects can be further characterized by one or any combination of the features or descriptions anywhere in this application.

Particles are "saturated" or "fully saturated" by a precursor at the point at which the precursor substantially stops reacting with the particles' surfaces. In practice, this is defined to be the point at which, at the coating conditions, less than 1% of the precursor reacts with the particles to form products. Both precursor and gaseous products can be measured in the exhaust stream from the reaction chamber. In some more preferred embodiments, saturation is taken to occur where less than 5%, or less than 10%, or less than 20%, or less than 50%, or less than 90% of the precursor reacts with the particles to form products.

The core particle is preferably metallic or semi-metallic and comprises hydrogen and/or an alkali or alkaline earth element. The core particle may comprise 50 to 99.9 mass %, or at least 60%, or at least 80%, or at least 90% of one or more transition metals plus silicon and 0.1 to 40 mass % alkali or alkaline earth element plus hydrogen; in some embodiments the core particle comprises a silicon or transition metal hydride (which may be or include a mixed-metal hydride) comprising 0.5 to 6 mass % H or 1 to 5 mass % H or 2 to 5 mass % H; in some embodiments, the particle contains no Si; in some embodiments, the particle contains no Li; in some embodiments the core particle comprises at least 60%, or at least 70%, or at least 90% of one or more transition elements and 40% or less or 30% or less or 10% or less of one or more alkali or alkaline earth element; in some embodiments the core particle comprises at least 60%, or at least 70%, or at least 90% of Al; in some embodiments the core comprises at least 90%, 95% or at least 99% (Al plus Li); in some embodiments, the alkali or alkaline earth fraction is primarily lithium, or at least 90% lithium, or primarily sodium or at least 90% sodium; in some embodiments the core is at least 50, 75, 90 or at least 95 or at least 98% of a single phase material. All % refer to mass % unless indicated otherwise.

It is believed that the coating methods of the present invention prevent or significantly reduce diffusion of the coating composition (especially the metal components of the coating composition) into the core material. Preferably, 10%, 5%, 2% or 1% or less of the coating layer (or metal component of the coating composition) or coating precursor (or metal component of the coating composition) is present within 10 nm or within 5 nm of the exterior of the coated particles. Like any collection of particles, the properties of the collection are preferably measured on the entire collection; where not practicable, the properties of the collection can be measured from a representative sample, and for purposes of the invention will be found in a majority of the representative sample having the recited characteristics, and in preferred embodiments at least 90% of a sample will exhibit the recited properties.

As used herein, the terms "same device or component in the absence of the thin film coating" and "similar device or component in the absence of the thin film coating" are used interchangeably herein and refer to the device or component that is produced using the same material and same process except for the absence of the thin film coating.

In one particular aspect of the invention, the highly-energetic material comprises a hydride, for example, aluminum hydride. Monometallic and multi-metallic hydride materials are suitable for use not just as fuels or for propulsion in propellants, ballistics and other systems or devices that benefit from high energy materials, but also for their hydrogen storage capacity for general energy applications, for magnetic materials, luminescent materials such as quantum dots and phosphors, and other uses. With respect to one or more of these uses, the inventive coatings and methods can provide:

Increased ambient stability and safety by reducing the hydride susceptibility to ambient moisture and oxygen. ALD coatings have been demonstrated as unsurpassed selective permeation barriers and are commercially implemented for sensitive electronics like flexible displays and photovoltaics. The target coating thicknesses can reduce moisture/oxygen permeation, while not adversely impacting $H_2$ transport.

Increased durability of aluminum hydride to humidity using $Al_2O_3$ ALD; the inventors have hypothesized that other ALD materials could provide similar benefits, particularly at surface area to volume ratios suited for rapid kinetics.

Enhanced (de)hydrogenation kinetics by acting as a catalyst/surface energy modifier. Recently, researchers at the National Renewable Energy Laboratory demonstrated reduced desorption temperatures and improved kinetics as a function of the thickness of $Al_2O_3$ ALD on $Mg(BH_4)_2$. A catalyst is critical to reduce the thermodynamic barrier of hydrogen adsorption and/or desorption, and the materials and processes described herein can further benefit these kinetic parameters; the inventive layers can be disposed in small weight percentages within and atop the metal hydride particles, and often result in a mechanically or chemically deposited catalyst coating. Such coatings will also double as a stabilizing layer to prevent oxidation of the metal hydride if they include readily oxidized metals which capture oxygen and form a dense layer screening the diffusion of larger molecules. Oxide coatings such as $Cr_2O_5$, $V_2O_5$, $Fe_2O_3$, TiO2 and $Nb_2O_5$ on Mg hydrides have all demonstrated the ability to markedly improve the sorption kinetics, oxidation resistance and to increase $H_2$ release over multiple cycles in other systems. Additionally, tuning the effects of interfacial interactions in nanoparticles, where much of the material is near enough surface to be affected, may suppress the adverse formation of stable intermediates, such as $Li_2B_{12}H_{12}$ from the dehydrogenation of $LiBH_4$, that hinder cyclability. The inventive processes and systems are suitable for producing such functionally-graded materials at high rates.

Reduced structural breakdown due to expansion/contraction during (de)hydrogenation cycling. The volume expansion/contraction imparted by hydrogen cycling of hydride materials is similar to stresses from lithium (de)intercalation for Li-ion anode and cathode materials. We and others have demonstrated ALD coatings can retard the propagation of particle cracking and other cycling induced degradation stemming from volumetric changes.

Increased packing density, flowability and thermal conductivity using nitride coatings. The combination of particle size, morphology and surface energy determines the cohesion and flowability of bulk powder, and thus the packing density/uniformity. Thus, modification of the size and surface functionality (e.g. hydride to oxide to nitride or hydroxide to aliphatic, etc) provides an opportunity to maximize $H_2$ loadings per unit volume. A homogeneously distributed bimodal (trimodal) mixture of two (three) discrete particle size regimes can impart volumetric packing efficiencies because one particle size can reside in the interstitial space of the other (FIG. 3). Nitrides (AlN and BN) are well-known thermal filler materials, with lubricating properties that can increase packing density. ALD of nitrides on metal hydrides can promote a more isothermal highly-packed particle bed, maximizing both the $H_2$ loading density and the uniformity of $H_2$ uptake/release.

The term "nanoparticles" refers to particles having average or median particle size of 1000 nm or less, typically 500 nm or less, often 400 nm or less, and most often 250 nm or less. Average particle size refers to mass average particle size. For asymmetric particles, particle size is determined by microscopy based on the smallest dimension through the center of a particle. Particle size distribution can be determined via ASTM B822-17. Alternatively, the term "nanoparticles" may refer to particles in which 80 mass % or more, typically 90 mass % or more and often 95 mass % or more of the particles have the particle size of 1000 nm or less, typically 800 nm or less, and often 600 nm or less. As used herein, the term "thin film" refers to a film or a coating of a material having mean or median thickness of about 20 nm or less, typically 10 nm or less, often 5 nm or less, and most often 3 nm or less and may refer to a mono-atomic or molecular layer of coating material. Alternatively, the term "thin film" refers to a film of from about 2 to about 6 nm in thickness.

Suitable precursors found to be useful in the methods to produce one or more compositions described herein may include one or more of aluminum sec-butoxide, aluminum tribromide, aluminum trichloride, diethylaluminum ethoxide, dimethylaluminum isopropoxide, tris(ethylmethylamido)aluminum, tris(dimethylamido)aluminum, triethylaluminum, triisobutylaluminum, trimethylaluminum, tris(diethylamido)aluminum, tris(ethylmethylamido)aluminum, trimethylantimony(III), triethylantimony(III), triphenylantimony(III), tris(dimethylamido)antimony(III), trimethylarsine, triphenylarsine, triphenylarsine oxide, barium bis(2,2,6,6-tetramethyl-3,5-heptanedionate) hydrate, barium nitrate, bis(pentamethylcyclopentadienyl)barium tetrahydrofuran, bis(triisopropylcyclopentadienyl)barium tetrahydrofuran, bis(acetate-O)triphenylbismuth(V), triphenylbismuth, tris(2-methoxyphenyl)bismuthine, diborane, trimethylboron, triethylboron, triisopropylboroate, triphenylborane, tris(pentafluorophenyl)borane, cadmium acetylacetonate, calcium bis(2,2,6,6-tetramethyl-3,5-heptanedionate), carbon tetrabromide, carbon tetrachloride, cerium(III) trifluoroacetylacetonate, tetrakis(2,2,6,6-tetramethyl-3,5-heptanedionat)cerium(IV), tris(cyclopentadienyl)cerium(III), tris(isopropylcyclopentadienyl)cerium(III), tris(1,2,3,4-tetramethyl-2,4-cyclopentadienyl)cerium(III), bis(cyclopentadienyl)chromium(II), bis(pentamethylcyclopentadienyl)chromium(II), chromium (III) tris(2,2,6,6-tetramethyl-3,5-heptanedionate), chromium (II) chloride, chromium(III) chloride, chromium(II) carbonyl, chromium(III) carbonyl, cyclopentadienyl(II) chromium carbonyl, bis(cyclopentadienyl)cobalt(II), bis(ethylcyclopentadienyl)cobalt(II), bis(pentamethylcyclopentadienyl)cobalt(II), tribis(N,N'-diisopropylacetaminato)cobalt(II), dicarbonyl(cyclopentadienyl)cobalt(III), cyclopentadienylcobalt(II) carbonyl, copper bis(6,6,7,7,8,8,8-heptafluoro-2,2-dimethyl-3,5-octanedionate, copper bis(2,2,6,6-tetramethyl-3,5-heptanedionate, (N,N'-diisopropylacetaminato)copper(II), tris(2,2,6,6-tetramethyl-3,5-heptanedionato)dysprosium(III), tris(isopropylcyclopentadienyl)dysprosium(III), erbium(III) tris(2,2,6,6-tetramethyl-3,5-heptanedionate), tris(butylcyclopentadienyl)erbium(III), tris(N,N-bis(trimethylsilyl)amide)europium(III), tris(tetramethylcyclopentadienyl)europium(III), nitrogen trifluoride, tris(N,N-bis(trimethylsilyl)amide)gadolinium(III), tris(cyclopentadienyl)gadolinium (III), tris(tetramethylcyclopentadienyl)gadolinium(III), gallium tribromide, gallium trichloride, triethylgallium, triisopropylgallium, trimethylgallium, tris(dimethylamido)gallium, tri-tert-butylgallium, digermane, germane, tetramethylgermanium, germanium(IV) fluoride, germanium(IV) chloride, hexaethyldigermanium(IV), hexaphenyldigermanium(IV), tributylgermanium hydride, triphenylgermanium hydride, dimethyl(acetylacetonate)gold(III), dimethyl(trifluoroacetylacetonate)gold(III), hafnium (IV) chloride, hafnium (IV) tert-butoxide, tetrakis(diethylamido)hafnium (IV), tetrakis(dimethylamido)hafnium (IV), tetrakis(ethylmethylamido)hafnium (IV), bis(tert-butylcyclopentadienyl)dimethylhafnium(IV), bis(methyl-n-cyclopentadienyl)dimethylhafnium, bis(trimethylsilyl)amidohafnium(IV) chloride, dimethylbis(cyclopentadienyl)hafnium(IV), hafnium isopropoxide, tris(N,N-bis(trimethylsilyl)amide)holmium(III), indium trichloride, indium(I) iodide, indium acetylacetonate, triethylindium, tris(dimethylamido)indium, tris(diethylamido)indium, tris(cyclopentadienyl)indium, 1,5-cyclooctadiene(acetylacetonato)iridium(I), 1,5-cyclooctadiene(hexafluoroacetylacetonato)iridium(I), 1-ethylcyclopentadienyl-1,3-cyclohexadieneiridium(I), (methylcyclopentadienyl)(1,5-cyclooctadiene)iridium(I), bis(N,N'-di-tert-butylacetamidinato)iron (II), bis(pentamethylcyclopentadienyl)iron(II), ferrocene, 1,1'-diethylferrocene, iron pentacarbonyl, iron(III tris(2,2,6,6-tetramethyl-3,5-heptanedionate), tris(N,N'-Di-tert-butylacetamidinato)lanthanum (III), lanthanum(III) isopropoxide, tris(N,N-bis(trimethylsilyl)amide)lanthanum (III), tris(cyclopentadienyl)lanthanum(III), tris(tetramethylcyclopentadienyl)lanthanum(III), tetraethyllead, tetramethyllead, tetraphenyllead, tithium t-butoxide, lithium trimethylsilylamide, lithium (2,2,6,6-tetramethyl-3,5-heptanedionate), tris(N,N-diisopropylacetamidinato)lutetium (III), lutetium(III) tris(2,2,6,6-tetramethyl-3,5-heptanedionate), bis(cyclopentadienyl)magnesium(II), bis(pentamethylcyclopentadienyl)magnesium(II), bis(pentaethylcyclopentadienyl)magnesium(II), bis(cyclopentadienyl)manganese(II), bis(N,N-diisopropylpentylamidinato)manganese(II), bis(ethylcyclopentadienyl)manganese(II), bis(pentamethylcyclopentadienyl)manganese(II), bis(isopropylcyclopentadienyl)manganese(II), cyclopentadienylmanganese tricarbonyl, manganese carbonyl, methylcyclopentadienylmanganese tricarbonyl, manganese tris(2,2,6,6-tetramethyl-3,5-heptanedionate), molybdenum hexacarbonyl, molybdenum (V) chloride, molybdenum (VI) fluoride, bis(cyclopentadienyl)molybdenum(IV) dichloride, cyclopentadienylmolybdenum(II) tricarbonyl, propylcyclopentadienylmolybdenum(I) tricarbonyl, tris(N,N-bis(trimethylsilyl)amide)neodymium(III), bis(methylcyclopentadienyl)nickel(II), allyl(cyclopentadienyl)nickel(II), bis(cyclopentadienyl)nickel(II), bis(ethylcyclopentadienyl)nickel(II), bis(triphenylphosphine)nickel(II) dichloride, nickel(II) bis(2,2,6,6-tetramethyl-3,5-heptanedionate), bis(cyclopentadienyl)niobium(IV) dichloride, niobium(V) chloride, niobium(V) isopropoxide, niobium(V) ethoxide, N,N-dimethylhydrazine, ammonia, hydrazine, ammonium fluoride, azidotrimethylsilane, triosmium dodecacarbonyl, allyl(cyclopentadienyl)palladium(II), palladium(II) hexafluoroacetylacetonate, bis(2,2,6,6-tetramethyl-3,5-heptanedionato)palladium(II), phosphine, tert-butylphosphine, tris(trimethylsilyl)phosphine, phosphorous oxychloride, triethylphosphate, trimethylphosphate, methylcyclopentadienyl(trimethyl)platinum (IV), chloroplatinic acid, praseodymium(III) hexafluoroacetylacetonate hydrate, dirhenium decacarbonyl, acetylacetonato(1,5-cyclooctadiene)rhodium (I), bis(ethylcyclopentadienyl)ruthenium (II), bis(cyclopentadienyl)ruthenium(II), bis(pentamethylcyclopentadienyl) ruthnenium(II), triruthenium dodecacarbonyl, tris(N,N-bis (trimethylsilyl)amide)samarium(III), tris (tetramethylcyclopentadienyl)samarium(III), tris(2,2,6,6-tetramethyl-3,5-heptanedionato)scandium(III), dimethyl selenide, diethyl selenide, 2,4,6,8-tetramethylcyclotetrasiloxane, dimethoxydimethylsilane, di silane, methyl silane, octamethylcyclotetrasiloxane, silane, tris(isopropoxy)silanol, tris(tert-butoxy)silanol, tris(tert-pentoxy)silanol, (3-aminopropyl)triethoxysilane, N-sec-butyl(trimethylsilyl) amine, chloropentamethyldisilane, hexamethyldisilazane, silicon(IV) chloride, silicon(IV) bromide, pentamethyldisilane, tetraethyl silane, N,N',N"-tri-tert-butylsilanetriamine, (2,2,6,6-tetramethyl-3,5-heptanedionato)silver(I), triethoxyphosphine(trifluoroacetonate)silver(I), silver(I) triethylphosphine(6,6,7,7,8,8,8-heptafluoro-2,2-dimethyl-3,5-octanedionate), trimethylphosphine (hexafluoroacetylacetonato)silver(I), vinyltriethylsilane (hexafluoroacetylacetonato)silver(I), strontium tetramethylheptanedionate, pentakis(dimethylamido)tantalum(V), tantalum(V) chloride, tantalum(V) ethoxide, tantalum(V) fluoride, tris(ethylmethylamido)tert-butylimido)tantalum(V), tris(diethylamido)(tert-butylimido)tantalum(V), tellurium tetrabromide, tellurium tetrachloride, terbium(2,2,6,6-tetramethyl-3,5-heptanedionate), tris(cyclopentadienyl) terbium(III), tris(tetramethylcyclopentadienyl)terbium(III), thallium(I) ethoxide, thallium(I) hexafluoroacetylacetonate, cyclopentadienylthallium, 2,2,6,6-tetramethyl-3,5-heptanedionatothallium(I), tris(N,N-bis(trimethylsilyl)amide)thulium(III), tris(cyclopentadienyl)thulium(III), tin(IV) chloride, tetramethyltin, tin(II) acetylacetonate, tin(IV) tert-butoxide, tin(II) hexafluoroacetylacetonate, bis(N,N'-diisopropylacetamidinato)tin(II), N,N-di-tert-butyl-2,3-diamidobutanetin(II), tetrakis(dimethylamino)tin(IV), bis (diethylamido)bis(dimethylamido)titanium (IV), tetrakis (diethylamido)titanium (IV), tetrakis(dimethylamido) titanium(IV), tetrakis(ethylmethylamido)titanium (IV), titanium (IV) bromide, titanium (IV) chloride, titanium (IV) fluoride, titanium (IV) tert-butoxide, titanium(IV) isopropoxide, titanium(IV) ethoxide, titanium(IV) methoxide, titanium(IV) isopropoxidebis(2,2,6,6-tetramethyl-3,5-heptanedionate), dichloro titanium(IV) oxide, bis(tert-butylimido) bis(dimethylamido)tungsten (VI), tungsten hexacarbonyl, tungsten (VI) chloride, tungsten (VI) fluoride, triaminetungsten(IV) tricarbonyl, cyclopentadienyltungsten(II) tricarbonyl hydride, bis(isopropylcyclopentadienyl)tungsten(IV) dihydride, bis(cyclopentadienyl)tungsten(IV) dihydride), bis(cyclopentadienyl)tungsten(IV) dichloride, bis(butylcyclopentadienyl)tungsten(IV) diiodide, bis(cyclopentadienyl) vanadium(II), vanadium(V) oxide trichloride, vanadium(V) oxytriisopropoxide, tris(N,N-bis(trimethylsilyl)amide)ytterbium(III), tris(cyclopentadienyl)ytterbium(III), tris(N,N-bis (trimethylsilyl)amide)yttrium (III), yttrium(III) tris(tert-butoxide), yttrium(III) triisopropoxide, yttrium(III) tris(2,2,6,6-tetramethyl-3,5-heptanedionate), tris (butylcyclopentadienyl)yttrium(III), tris(cyclopentadienyl) yttrium(III), yttrium 2-methoxyethoxide, diethylzinc, dimethylzinc, diphenylzinc, bis(2,2,6,6-tetramethyl-3,5-heptanedionate)zinc(II), bis(pentafluorophenyl)zinc, zirconium(IV) dibutoxide(bis-2,4-pentanedionate), zirconium (IV) 2-ethylhexanoate, zirconium tetrakis(2,2,6,6-tetramethyl-3,5-heptanedionate), bis(cyclopentadienyl) zirconium(IV) dihydride, bis(methyl-n-cyclopentadienyl) methoxymethylzirconium, tetrakis(diethylamido)zirconium (IV), dimethylbis(pentamethylcyclopentadienyl)zirconium (IV), tetrakis(dimethylamido)zirconium (IV), tetrakis(ethylmethylamido)zirconium (IV), zirconium (IV) bromide, zirconium (IV) chloride, zirconium (IV) tert-butoxide, and a mixture of any two or more thereof. Precursors for the synthesis of powders and particles, and occasionally for their encapsulation, oftentimes include metal salts and hydroxides, and administered as a dry powder, liquid or gaseous feedstock, or as dissolved in a suitable solvent, via an injection device, nozzle, spray device, vaporizer, sonicator, or other known sub-component. Metal salts may be in the form of halides, sulfates, nitritates, oxalates, phosphates, or other inorganic or organic compounds of Ac, Ag, Al, Am, As, At, Au, B, Ba, Be, Bh, Bi, Bk, Br, C, Ca, Cd, Ce, Cf, Cm, Cn, Co, Cr, Cs, Cu, Db, Ds, Dy, Er, Es, Eu, Fe, Fl, Fm, Fr, Ga, Gd, Ge, H, Hf, Hg, Ho, Hs, In, K, La, Li, Lr, Lu, Lv, Mc, Md, Mg, Mn, Mo, Mt, N, Na, Nb, Nd, Nh, Ni, No, Np, O, Og, Os, P, Pa, Pb, Pd, Pm, Po, Pr, Pt, Pu, Ra, Rb, Re, Rf, Rg, Rh, Ru, S, Sb, Sc, Se, Sg, Si, Sm, Sn, Sr, Ta, Tb, Tc, Te, Th, Ti, Tl, Tm, Ts, U, V, W, Y, Yb, Zn, Zr, or combinations thereof.

In at least one embodiment, the precursor includes one or more of phosphorous, sulfur, nitrogen, carbon, fluorine, chlorine, bromine or iodine. In at least one embodiment, the precursor includes a phosphide, a phosphate, a sulfide, a sulfate, a nitrate, a fluoride, a chloride, a bromide or an iodide. In all embodiments, one or more ligands of the aforementioned precursors is desirable to obtain a controllable coating, a controllable interdiffused layer, and/or specific target compositions.

The invention is sometimes described using the term "comprising" which means including; and in any of the inventive concepts the term "comprising" may, in narrower embodiments, be replaced by "consisting essentially of" to exclude elements that would substantially degrade the properties of a layer, or, in the narrowest embodiments as "consisting of."

DETAILED DESCRIPTION OF THE INVENTION

In one aspect of the disclosure, a coated fuel particle is provided, which may comprise a metal or metal alloy. Such a metal or metal alloy fuel may comprise a lithium aluminum (Li—Al) alloy, a lithium-silicon (Li—Si) alloy, or one or more of the myriad types of metal fuels and energetic materials. A Li—Al or Li—Si alloy is coated with one or more of a metal, metalloid or non-metal in the form of a zero-valent element, and/or in the form of an oxide, a nitride, a carbide, a halide, or a phosphate is provided; each coating may be a composite comprising one, two or more cations and/or one, two or more anions. Non-limiting examples of such include composite coatings that comprise silicon oxide and aluminum oxide, aluminum oxide and silicon nitride, silicon oxide and aluminum nitride, silicon oxide and aluminum phosphate. Such a coating may be applied using a solid state, liquid state or vapor state process. Examples of solid state processes include mixing and cladding. Examples of liquid state processes include chemical bath deposition, sol-gel, electrodeposition and similar. Examples of vapor deposition techniques can include molecular layering (ML), chemical vapor deposition (CVD), physical vapor deposition (PVD), atomic layer deposition (ALD), molecular layer deposition (MLD), vapor phase epitaxy (VPE), atomic layer chemical vapor deposition (ALCVD), ion implantation or similar techniques. In each of these, coatings are formed by exposing the powder to reactive precursors, which react either in the vapor phase (in the case of CVD, for example) or at the surface of the powder particles (as in ALD and MLD).

Figure 2:
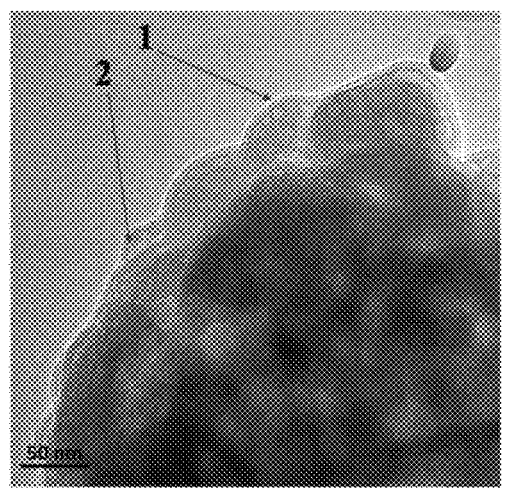
FIG. 2 is a transmission electron microscope (TEM) image of an aluminum lithium alloy particle coated with a thin film of alumina. Energy Dispersive X-Ray Analysis (EDX) confirmed the presence of aluminum and oxygen over the entire surface of the particle. The top arrow points to the outer surface 1 of the thin film and the lower arrow 2 points to a different phase just underlying the top layer.

It has been discovered that additional processing steps are required to adequately apply vapor-phase coatings onto energetic materials comprising Alkali and Alkaline Earth metals (Groups I and II of the periodic table) due to unexpected interactions between the substrate surfaces and the precursor molecules. In the CVD or ALD process, suitable precursors to deposit an aluminum cation may include one or more of aluminum sec-butoxide, aluminum tribromide, aluminum trichloride, diethylaluminum ethoxide, dimethylaluminum isopropoxide, tris(ethylmethylamido)aluminum, tris(dimethylamido)aluminum, triethylaluminum, triisobutylaluminum, trimethylaluminum, tris (diethylamido)aluminum, or tris(ethylmethyl-amido) aluminum. These can be coupled simultaneously or sequentially with other anion-forming precursors to produce compounds described above, or a reducing precursor to produce a coating at least partially comprising a zero-valent form of an element. For example, trimethylaluminum and water, hydrogen peroxide, ozone or oxygen plasma may be used to deposit aluminum oxide, $Al_2O_3$; tris(diethylamido) aluminum and anhydrous ammonia may be used to deposit AlN coatings; an aluminum-comprising precursor may be paired simultaneously or sequentially with phosphine, tert-butylphosphine, tris(trimethylsilyl)phosphine, phosphorous oxychloride, triethylphosphate, trimethylphosphate to form an aluminum phosphate coating. Alternatively or in addition to, a cation-containing precursor may be paired with a multi-functional organic precursor such as ethylene glycol, ethanolamine, ethylene diamine, glycerol, glycidol or similar, to form an aluminum cation and an anion comprising carbon. However, the inventors have discovered that challenges arise when applying ALD coatings to Group I and II elements (and compounds comprising said elements), due to their ease of mobility, diffusivity, reactivity or other attribute that creates a diffusion layer interface between the substrate and coating, which is not predicted by classical ALD theory. FIG. 2 shows such an example in a transmission electron microscope image of a coated metal fuel particle having a distinct coating on the outside of the particle.

Figure 3:
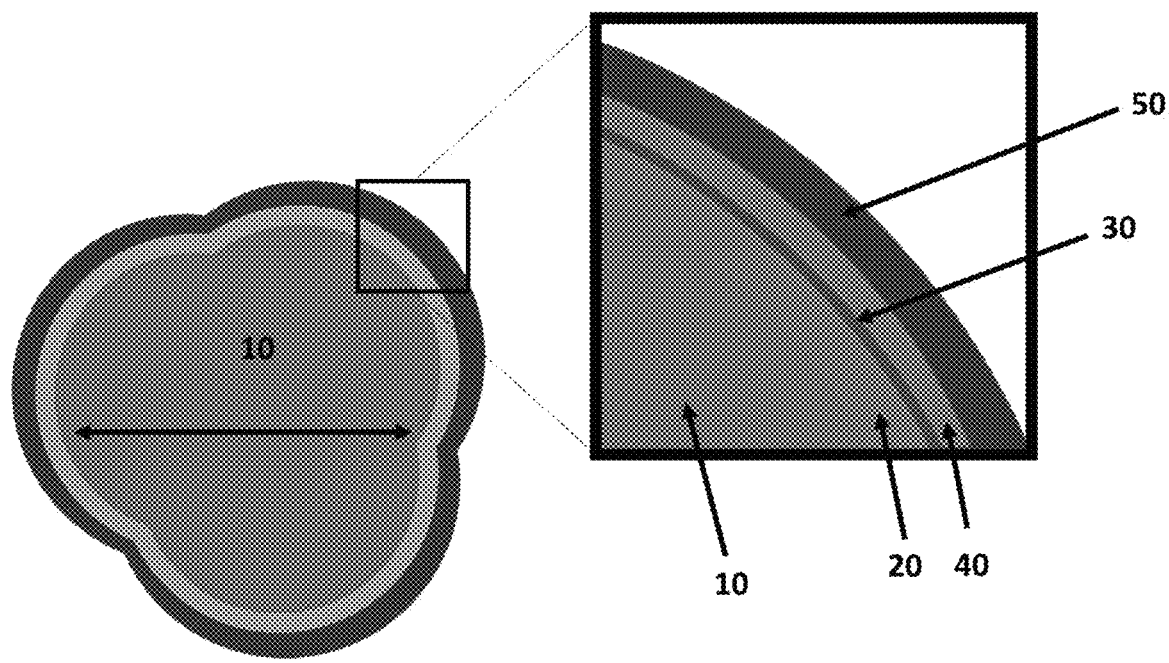
FIG. 3 is a schematic illustration of a coated particle.

One or more of aluminum, silicon, boron, hafnium, tin, iron, magnesium, titanium, zirconium or beryllium are sometimes preferred coating cations over other cation materials. In some embodiments, aluminum and/or silicon are preferred, and within these, aluminum may be more beneficial when interfaced directly with the particle surface. In most embodiments, a metal fuel material is at least partially coated with a protective coating, wherein the metal fuel material is in the form of a powder comprised of a plurality of particles. A coating may comprise one or more elements in a zero-valent state, and/or one or more cations paired with one or more anions in various preferential compositions and ratios. As depicted in FIG. 3, a coated metal fuel particle comprises at least a metal fuel particle, a coating, and optionally a diffusion layer, where the composition and thickness of the diffusion layer and coating layers are controllable based upon the selected process conditions. As further depicted in FIG. 3, a coated metal fuel particle comprises at least a metal fuel particle 10, a coating 50, which is applied to the original interface position 30 of the coating layer prior to any diffusion. During or after the coating process, interface position 30 may disappear, forming an optional diffusion layer may optionally further comprise a first interdiffusion layer 20, and/or a second interdiffusion layer 40. First interdiffusion layer 20 represents inward diffusion of the coating material penetrating into the substrate particle dimension; second interdiffusion layer 40 represents outward diffusion of the substrate composition into the coating material thickness dimension. In the simplest case, a coating 50 does not have an interaction with the metal fuel particle 10, such that interface 30 is ~0.1 to 1.0 nanometers in thickness, and interdiffusion layers 20 and 40 are not present, and typically the thickness of 30 is independent of the thickness of coating 50. Though this case is challenging to achieve with metal fuel particles that comprise lithium, silicon and/or aluminum, precise coating processes such as ALD can effectively achieve such a coated metal fuel particle if desirable. As described herein, a metal fuel particle 10, a coating 50 and at least one interdiffusion layer may provide benefits including mechanical stability and environmental robustness during post processing steps. When at least one interdiffusion layer is present, it may be challenging to identify and/or isolate an interface 30 between 10 and 50. Preferential processes will apply a coating 50 of 1 nanometer to 500 nanometers in thickness, and form a diffusion layer having a total thickness (20+40) of 0.1 to 33% of the coating thickness. Preferential diffusion layers will have a thickness of 20 greater than a thickness of 40, where the thickness of the first interdiffusion layer 20 is at least 10%, preferably 25%, oftentimes 50%, and sometimes 100% greater than the thickness of the second interdiffusion layer 40.

In some embodiments, coating 50 is in an amorphous or glassy phase. Such coatings may provide superior stability against reactivity with moisture, air or other environmental constituent. Coating 50 may increase the shelf-life of a metal fuel particle by 10, 20, 50 or 100%, and/or prevent the premature ignition of the metal fuel in a solid-rocket propellant. Silicate and aluminate materials are preferred for enhancing moisture stability of metal fuel particles. In some embodiments, coating 50 comprises at least 80% silicate and has a thickness of 2 to 20 nanometers. In other embodiments, coating 50 comprises at least 80% aluminate and has a thickness of 2 to 20 nanometers. Coating 50 may comprise an oxide, nitride, halide or phosphate of a metal, metalloid or non-metal, and optionally form a first interdiffusion layer 20 that comprises 60-90% lithium or aluminum, a second interdiffusion layer 40 that comprises 10-40% lithium or aluminum, or both.

In some embodiments, a coated metal fuel particle comprises a Li—Al or Li—Si alloy having an average particle size of 10 to 100 microns, a first coating of an aluminum oxide layer of 0.1 to 5.0 nanometers in thickness using an ALD process, and a second coating of a silicon oxide layer of 0.1 to 5.0 nanometers in thickness using an ALD process. Under certain conditions, a first interdiffusion layer and a second interdiffusion layer may each comprise $Li_aAl_bSi_cO_d$. Preferred ranges for a first interdiffusion layer include: $0.1<a<0.2$, $0.6<b<0.9$, $0<c<0.1$, and $0.01<d<0.2$; Preferred ranges for a second interdiffusion layer include: $0<a<0.05$, $0.2<b<0.8$, $0.01<c<0.3$, and $0.2<d<0.6$.

In preferred embodiments, a coated metal fuel particle comprises a Li—Al or Li—Si alloy having an average particle size of 10 to 100 microns, and at least one coating comprising a metal, metalloid or non-metal cation X, and an anion Y selected from O, N, C, F, Cl, Br, I and P or combinations thereof, and wherein X is selected from the group Ac, Ag, Al, Am, As, At, Au, B, Ba, Be, Bh, Bi, Bk, Ca, Cd, Ce, Cf, Cm, Cn, Co, Cr, Cs, Cu, Db, Ds, Dy, Er, Es, Eu, Fe, Fm, Fr, Ga, Gd, Ge, Hf, Hg, Ho, Hs, In, K, La, Li, Lr, Lu, Lv, Mc, Md, Mg, Mn, Mo, Mt, Na, Nb, Nd, Nh, Ni, No, Np Og, Os, P, Pa, Pb, Pd, Pm, Po, Pr, Pt, Pu, Ra, Rb, Re, Rf, Rg, Rh, Ru, S, Sb, Sc, Se, Sg, Si, Sm, Sn, Sr, Ta, Tb, Tc, Te, Th, Ti, Tl, Tm, Ts, U, V, W, Y, Yb, Zn, Zr, or combinations thereof, and XY is applied using an Atomic Layer Deposition process. The resulting composition is an Li—Al alloy particle having the form $Li_aAl_bX_cY_d$ where $a+b+c+d=1$, $0.12<a<0.3$, $0.7<b<0.88$, $c=0$ and $d=0$; an interdiffusion layer having the form $Li_aAl_bX_cY_d$ where $a+b+c+d=1$, $0.02<a<0.2$, $0.1<b<0.6$, $0.1<c<0.4$, and $0.1<d<0.6$; and a coating layer $Li_aAl_bX_cY_d$. where $a+b+c+d=1$, $a=0$, $b=0$, $0.2<c<1$, and $0<d<0.86$.

Yet in other embodiments, the thin film of reliability-improving material does not significantly affect the sintering of said particles. As used herein, the term "sintering" refers to atomistic diffusion between nanoparticle and the thin film or atomistic diffusion between particles. Also as used herein, the term "does not significantly affect the sintering of said particles" means the amount of sintering or the sintering temperature in the presence of the thin film coating is substantially similar to the amount of sintering or the sintering temperature of the same particles in the absence of a thin film coating. Generally, the amount of particle sintering in the presence of the thin film coating is no more than 15%, typically no more than 10%, and often no more than 5% different compared to the amount of particle sintering in the absence of the thin film coating. Alternatively, the sintering temperature in the presence of the thin film coating is within 50° C., typically within 30° C., and often within 20° C. of the particle sintering temperature in the absence of the thin film coating.

Still in other embodiments, the thin film of reliability-improving material comprises a thin film of wide bandgap material. As used herein, the term "wide bandgap material" refers to materials with electronic band gaps significantly larger than 1.5 electron volt (eV), typically larger than 3.0 eV, and often larger than 5.0 eV. In some instances, the wide bandgap material comprises a material selected from the group consisting of aluminum oxide, hafnium oxide, zirconium oxide, tantalum oxide, niobium oxide, lithium oxide, silicon oxide, calcium oxide, magnesium oxide, boron oxide, aluminum phosphate, titanium phosphate, lithium phosphate, calcium phosphate, aluminum nitride, gallium nitride, boron nitride, boron carbide, and a combination thereof. Still in other instances, the thickness of the thin film coating of wide bandgap material is 8 nm or less, typically 5.5 nm or less, and often 3.5 nm or less.

In other embodiments, the thin film of reliability-improving material comprises a thin film of semiconducting or conducting material. Exemplary semiconducting materials that are suitable for the present invention include, but are not limited to, zinc oxide, titanium oxide, cerium oxide, vanadium oxide, barium oxide, bismuth oxide, ruthenium oxide, indium oxide, tin oxide, lanthanum oxide, titanium nitride, tantalum nitride, silicon carbide, and ternary or quaternary combinations that include these and other analogous materials. Exemplary conducting materials that are useful in the present invention include, but are not limited to, metals (such as platinum, silver, gold, titanium, copper, zinc, chromium, nickel, iron, molybdenum, tungsten, ruthenium, palladium, indium, and tin), alloys or intermetallics (such as PtNi, FeCrAlY, AgPd, nichrome, and other conductive steels) and other electric conducting materials such as those containing carbons (such as graphite, graphene, diamond and diamond like carbon, and PEDOT and other conductive polymers). Such a thin film of controlled conductivity can provide a critical range in which a triggering event may be designed to occur, improving the metrics around the energy release. It was unexpected at the time of discovery that adjacent layers of functionally-graded materials designed around successive triggered release metrics could be used as a delayed-release mechanism, providing enhanced operational use time.

In one particular embodiment, the resistivity of said thin film of reliability-improving material is 50,000 μΩ-cm or less, typically 5,000 μΩ-cm or less, and often 500 μΩ-cm or less.

Yet in other embodiments, the thin film of reliability-improving material comprises a dopant material. Exemplary dopant materials that are useful in the invention include, but are not limited to, +5 valence materials into +4 valence materials (such as tantalum oxide doped into titanium oxide), +3 valence materials into +2 valence materials (such as aluminum oxide doped into zinc oxide), and commonly known doped transparent conductive oxides (such as fluorine-doped tin oxide). Typically, the dopant material increases the conductivity of the thin film of reliability-improving material by at least 20%, often by at least 50% and most often by at least 100%.

Still in other embodiments, a thermal oxidation onset temperature of the particles with the thin film coating is at least 10° C., typically at least 25° C., and often at least 100° C. higher than the same nanoparticles in the absence of said thin film of oxidation-resistant material.

Yet still in other embodiments, the average particle size of said particles is 1,000 nm or less, typically 800 nm or less, and often 500 nm or less. In many embodiments, larger particles are mixed with smaller particles as a means of increasing the overall tap density of the energetic materials, forming a bi-modal or multi-modal particle size distribution. In such embodiments, the thickness of the coating solution may be inversely proportional to the average diameter of the particles. In other embodiments, coated materials may be blended with uncoated materials. In certain embodiments, the output of the initiation event at the surface of uncoated materials (or materials having a different particle size) serves as the initiation event at the surface of another group of particles in the same device or system.

In many embodiments, the coating material compound comprises one or more of a: (i) metal oxide; (ii) metal halide; (iii) metal oxyflouride; (iv) metal phosphate; (v) metal sulfate; (vi) non-metal oxide, (vii) olivines, (viii) NaSICON structures, (ix) perovskite structures, (x) spinel structures, (xi) polymetallic ionic structures, (xii) metal organic structures or complexes, (xiii) polymetallic organic structures or complexes, (xiv) structures with periodic properties, (xv) functional groups that are randomly distributed, (xvi) functional groups that are periodically distributed, (xvii) functional groups that are checkered microstructure, (xviii) 2D periodic arrangements, and (ixx) 3D periodic arrangements;

Another aspect of the invention provides a device or component comprising a plurality of highly-energetic particles that are coated with a thin film of a reliability-improving material. Exemplary materials that are useful in the present invention include nanoparticles coated by materials including, but are not limited to, barium titanate, strontium titanate, barium strontium titanate, barium niobate, strontium niobate, barium strontium niobate, sodium niobate, potassium niobate, sodium potassium niobate, titania, zirconia, lead zirconate, lead zirconate titanate, calcium copper titanate, bismuth scandium oxide, bismuth zinc oxide, bismuth titanate, bismuth zinc titanate, zinc oxide, and zinc titanate. In some embodiments, the reliability-improving material comprises $SiO_2$, $ZrO_2$, $B_2O_3$, $Bi_2O_3$, $Li_2O$, or a mixture thereof.

Still in other embodiment, the thin film coating reduces the densification onset temperature of said particles, or is a promoter of a particular interdiffusion layer composition and/or thickness that is preferentially constructed between the substrate and the coating as a result of a controlled interaction process. As used herein, the term "densification" means atomistic diffusion between or within the thin films, and/or interactions with additional densification aids (such as binders, glass or glass-forming powders) present in the system, as relevant. Also as used herein, the "densification onset temperature" means the temperature at which nanoparticles coated with thin films begin to densify and reduce the void space present between a plurality of said nanoparticles. The densification temperature of nanoparticles in the absence of a thin film coating is the same as the sintering temperature of the nanoparticles. For an energetic material, this densification may occur prior to constructing the device, or may be triggered to occur as a feature of the device itself. Alternatively, the thin film coating may serve as a solid precursor to liquid phase sintering of the nanoparticles, at temperatures substantially lower than the traditional sintering temperature of said nanoparticles. In general, the densification temperature of the nanoparticles is at least 25° C. lower, typically by at least 50° C. lower, and often by at least 100° C. lower than the sintering temperature of the same nanoparticles in the absence of the thin film coating.

In one particular embodiment, said particles comprise a lithium-containing metal or metal alloy fuel and said reliability-improving material comprises an oxide of a metal comprising bismuth, zinc, titanium, scandium, or a mixture thereof. In some instances within this embodiment, said reliability-improving material comprises zinc titanium oxide, bismuth zinc titanium oxide or bismuth scandium oxide.

In another embodiment, said particles comprise hydrogen and/or lithium, and said reliability-improving material comprises an oxide, nitride or phosphate of a metal selected from the group consisting of tantalum, sodium, potassium, or a mixture thereof. In some instances within this embodiment, said reliability-improving material comprises an alkali tantalate.

Yet in another particular embodiment, said reliability-improving material increases the mean time to initiation by at least 10% relative to the same device or component in the absence of said thin film of reliability-improving material.

Still in another particular embodiment, said thin film of reliability-improving material reduces the average grain size of sintered or aggregated particles by at least 20 nm, typically by at least 50 nm, and often by at least 100 nm when combined into dense parts.

A thin film coating present on the particles of the invention may reduce or prevent agglomeration or sintering at high temperature, e.g., during forming gas reduction process. In some cases, the thin film coating, e.g., $SiO_2$ coating, may reduce or prevent agglomeration or sintering but is thin enough to be permeable to reducing gas such as hydrogen while preventing sintering of nanoparticles. In some instances, compositions of the invention include MLD-coated particles where the thin film coatings become porous ceramic oxides to allow gas flow. In such instances, a second coating of thin film can be applied, e.g., after heat treatment. In other instances, the second coating of thin film provides an impermeable dielectric layer.

The thin film of coating can be applied to highly-energetic particles using a batch process, a semi-continuous process (e.g. as described in the aforementioned patent application entitled "Semi-Continuous Vapor Deposition Process For The Manufacture of Coated Particles"), one or more types of continuous processes (U.S. Patent Application Publication No. 20120009343 or U.S. patent application Ser. No. 15/426,789), as well as variations thereof including plasma-enhanced processes, or a combination thereof. The thin film coating in preferred embodiments is produced at least in part using an atomic layer deposition or molecular layer deposition process.

Figure 4:
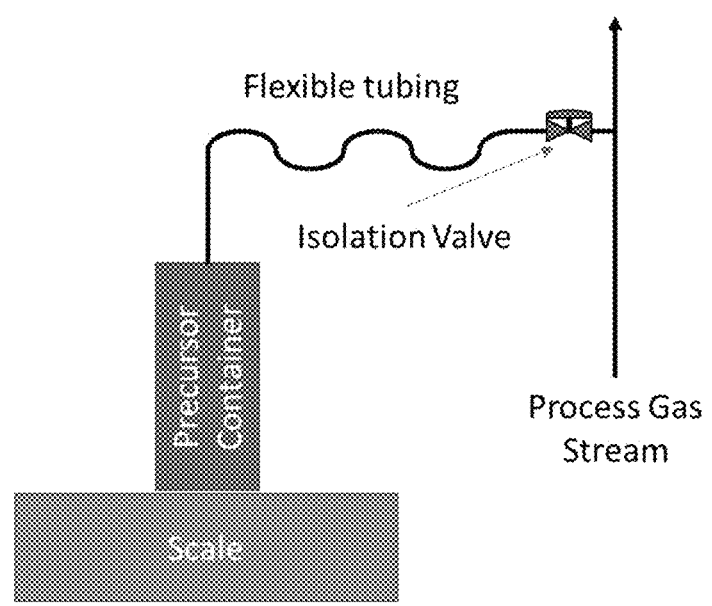
FIG. 4 is a schematic illustration of a system in which the change in mass is used to measure the mass of precursor delivered to a coating system.

A batch process for coating powdered substrates requires the intermittent delivery of known amounts of vaporized precursors, potentially in large quantities. This limits many traditional delivery methods, like thermal mass flow controllers, which are geared to more consistent, continuous flows of chemicals and require a consistent and minimum threshold pressure differential across the device. For large scale powder coatings, where tens of grams of precursor must be delivered in a single pulse, this can be accomplished using a loss-in-weight monitoring process. The precursor container rests on a scale and is connected to the deposition system via flexible tubing that allows for the deflection of the precursor container in proportion to its mass. See FIG. 4. As the liquid precursor vaporizes and enters the process stream, the mass in the container decreases. This change is detected in real-time by the scale, allowing for the delivered amount to be monitored. A calibration factor for the measured mass change can be used to compensate for any potential offsetting force on the container of the flexible line connecting the container to the deposition system. The loss-in-weight monitoring of the precursor container can be used both for feedback control of the precursor dosing, and as continuous process monitoring of the amount of precursor remaining on the system. This can be important when safety regulations limit the total amount of a hazardous precursors allowed on a coating system, and it necessary to know when to switch to a new container to prevent process interruptions.

Figure 1:
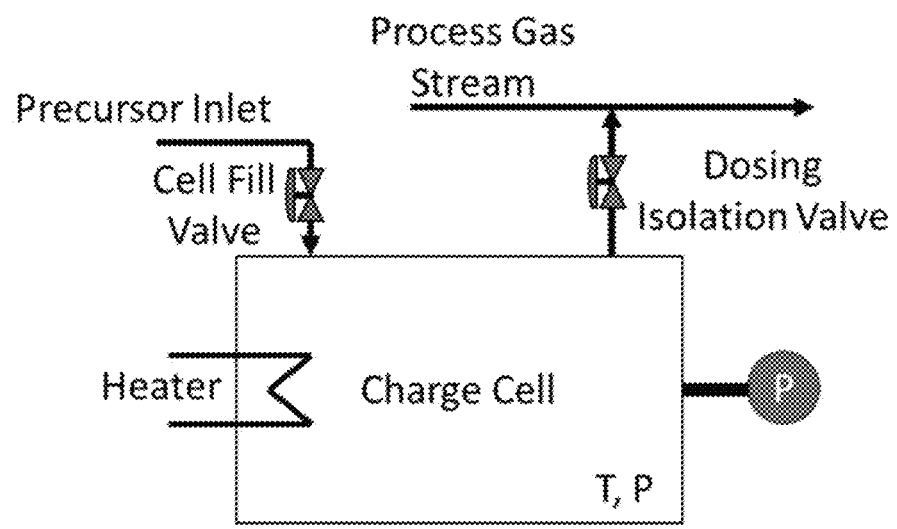
FIG. 1 schematically illustrates a precursor charge cell.

Vaporization and delivery of the precursor can be a rate-limiting step for the batch ALD coating of powders. To speed this step up, precursor can be charged to a container of known volume and temperature prior to the dosing step (FIG. 1). The precursor in the cell is maintained as a vapor at a higher pressure than the process gas stream and reaction vessel. When dosing of the precursor is required, an isolation valve is opened, and the pressure differential results in viscous flow of the precursor to the process gas stream and reactor vessel. The amount of precursor dosed can be monitored by measuring the pressure change in the charge cell (and temperature if needed). When a target amount has been dosed, the dosing isolation valve can be closed. As the powder in the reactor proceeds through the other steps in the process, such as soaks and purges, the charge cell can be refilled with precursor and allowed to equilibrate to the target temperature and pressure. The precursor can be added either as a vapor or as a liquid that vaporizes when heated to the temperature and pressure conditions of the cell.

Figure 12:
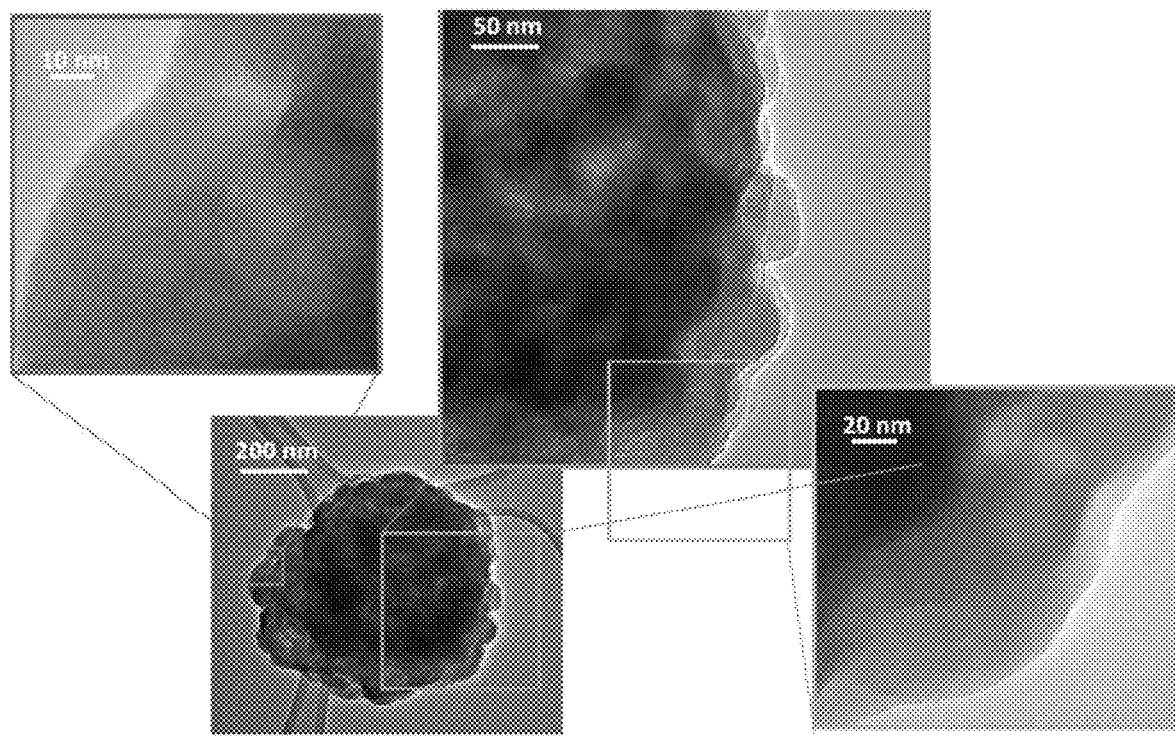
FIG. 12 shows TEM images of coated AlLi particles showing a graded interface where the boundary between the coating and the particle is not well defined.
Figure 13:
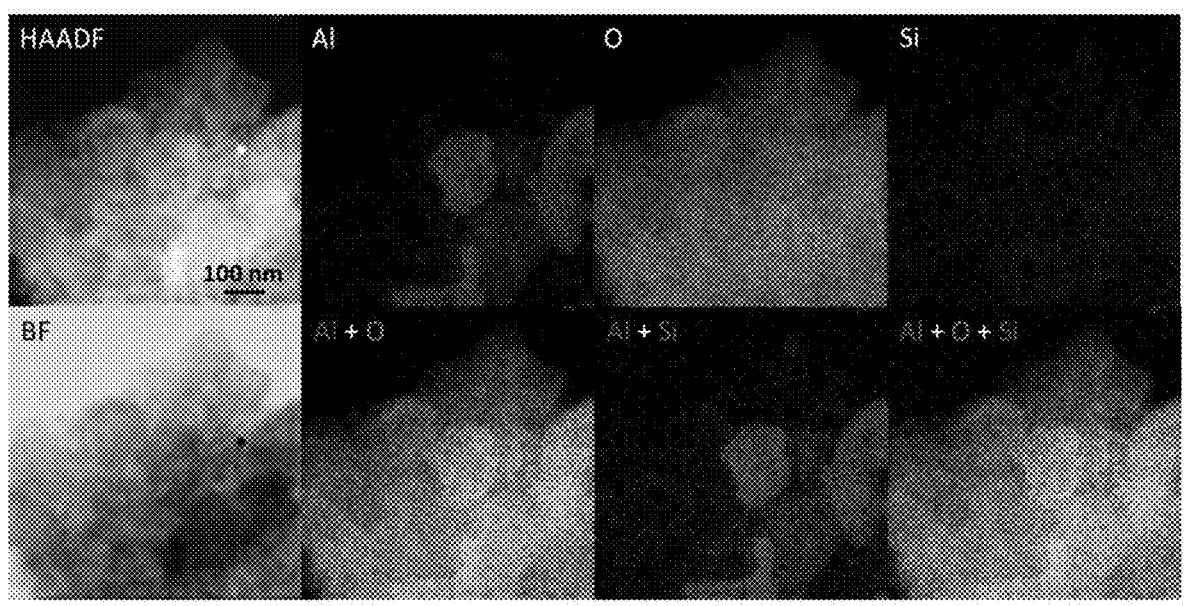
FIG. 13 is based on TEM/EDX images showing that too much subsurface infiltration (or the wrong process conditions) caused substrate degradation from Li/Al alloy separation.

In cases where ALD precursors react with the substrate (for example, TMA and water reacting with the AlLi substrate), the initial ALD cycles include some level of subsurface diffusion and/or non-self-limiting reaction. Lower deposition temperatures help limit this interaction. However, the deposition temperature must be sufficiently high to maintain the vapor pressure of the precursors (without condensation) at the flux required for the material throughput desired for production. Once a surface coating is nucleated, the growing film starts to act as a barrier for diffusion/reaction of the ALD precursor and allows for more efficient (exterior) coating growth. Higher flux and greater exposure of the precursors to the surface initially helps to nucleate a surface coating faster; however, higher flux and higher exposure also leads to more adverse reaction, material degradation (see TEM images in FIG. 12) and adverse processing characteristics such as powder sticking and aggregation. In the extreme, the entire powder bed can seize. Powder aggregation is a significant barrier to high throughput processing. Some of this can be managed with during or post process milling or sieving, but processes that provide a barrier coating without aggregation are advantageous.

Generically, an ALD is simple, is monitored by in-situ tools or defined by a series of saturation experiments, and can be broken into these steps:
 1) Dose first precursor to saturation
 2) Purge out precursor and biproducts
 3) Does second precursor to saturation
 4) Purge out second precursor and biproducts If this technique is applied to certain reactive powders (especially aluminium alloys such as AlLi alloy), either the barrier performance is poor because there is insufficient external barrier, or more likely the powder aggregates, or both.

We have found that the ALD process can be improved by breaking into different phases:

Phase 1: initial deposition onto untreated surface. Water is purposely underdosed and TMA initially dosed high (more than needed to saturate) and can be decreased on successive cycles but still higher than expected needed to saturate the surface. This is done to quickly saturate the subsurface with limited aggregation of the powder (suspected to be mostly caused by water). This phase preferably lasts 2-5 ALD cycles.

Phase 2: increasing the amount of water and the amount of TMA exposed to nucleate a barrier layer on the surface. Excess water aids in nucleating an $Al_2O_3$ rich interface.

Phase 3: grow an increasingly self-limiting surface layer.

Phase 4: once a complete ALD layer is established a more typical ALD process can be established and the exposures reduced to what would saturate the surface.

To avoid over-exposing any portion of the powder bed the precursors are each delivered in sub-saturating doses. So that a recipe proceeds:
 1) Mini DOSE Precursor1
   a. Mini-Dose Prec1 (mini-dose=dose amount of precursor less than required to fully saturate all the surfaces*
   b. Hold prec1 in the chamber
   c. purge to clear manifold*
   d. Hold Prec1 in the chamber
   e. Evacuate and purge chamber
   f. Blowback exhaust line
   g. REPEAT back to "a" as many times a required
 2) PURGE Precursor 1
   a. Evacuate the chamber
   b. Purge the chamber
   c. Evacuate the chamber
   d. Repeat back to "a" as many times as required 3) Mini Dose Precursor 2
   a. Mini-Dose Prec2 (mini-dose=dose amount of precursor less than required to fully saturate all the surfaces*
   b. Hold prec1 in the chamber
   c. purge to clear manifold*
   d. Hold Prec1 in the chamber
   e. Evacuate and purge chamber
   f. Blowback exhaust line
   g. REPEAT back to "a" as many times as required
4) Purge Precursor 2
   a. Evacuate the chamber
   b. Purge the chamber
   c. Evacuate the chamber
   d. Repeat back to "a" as many times as required
5) 1 full ALD cycle complete. Repeat back to 1 as many ALD cycles as required.

Note: the speed of delivery (the amount of precursor required per dose) for high throughput runs requires that the precursors be delivered with a sweep gas flowing to bring the manifold/system into the viscous flow regime. Dosing the precursors alone does not achieve this.

Materials that are air and/or moisture sensitive, such as AlLi alloy particles need a barrier coating to prevent degradation, especially where it is desired to be able to store the materials for several years without degradation. The global location of storage (i.e. ambient conditions) and the method of storage of the powders are typically unknown. We have developed two accelerated tests to assess the quality of the coatings. We found that method 2 (temperature hold) is better for differentiation of the different kind of coatings and is probably more representative of real-world conditions. In both methods, an inert gas is bubbled through water and the humidified gas is passed onto the powder while mass of the solid is measured by thermal gravimetric analysis (TGA).

The water bubbler was held at a fixed temperature with a water bath. Argon was bubbled through the water at a constant rate and then into the TGA.

Figure 5:
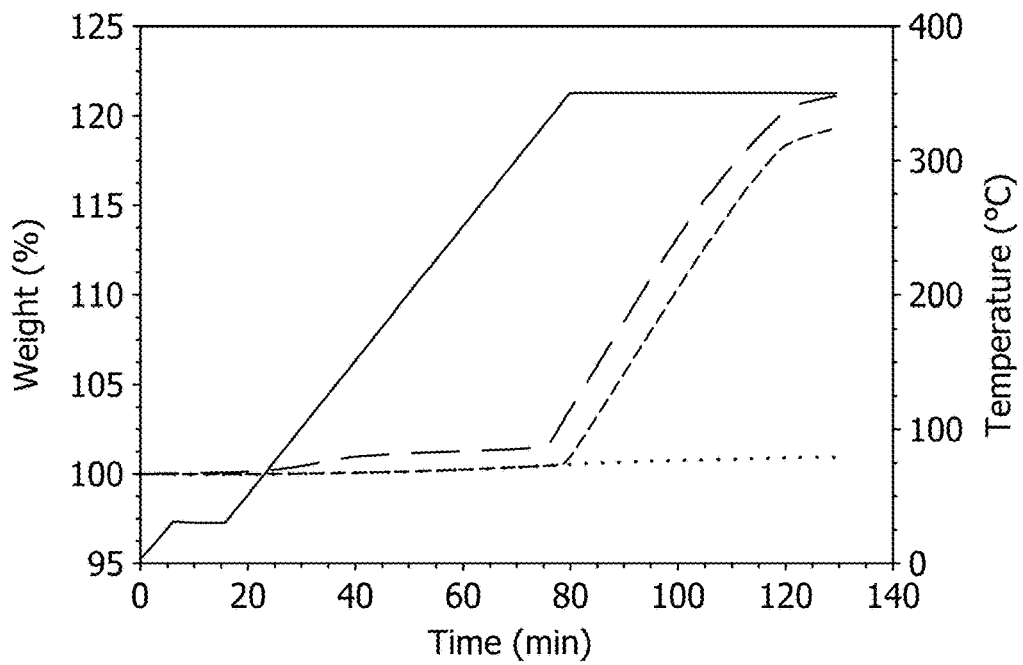
FIG. 5 is a TGA plot of percent weight vs. time. The temperature ramp vs time is shown on the left (95 to 120° C.). The trace to the right of the ramp is uncoated particles. Traces for the coated samples are shown to the right of the uncoated sample with one sample having essentially constant mass.
Figure 6:
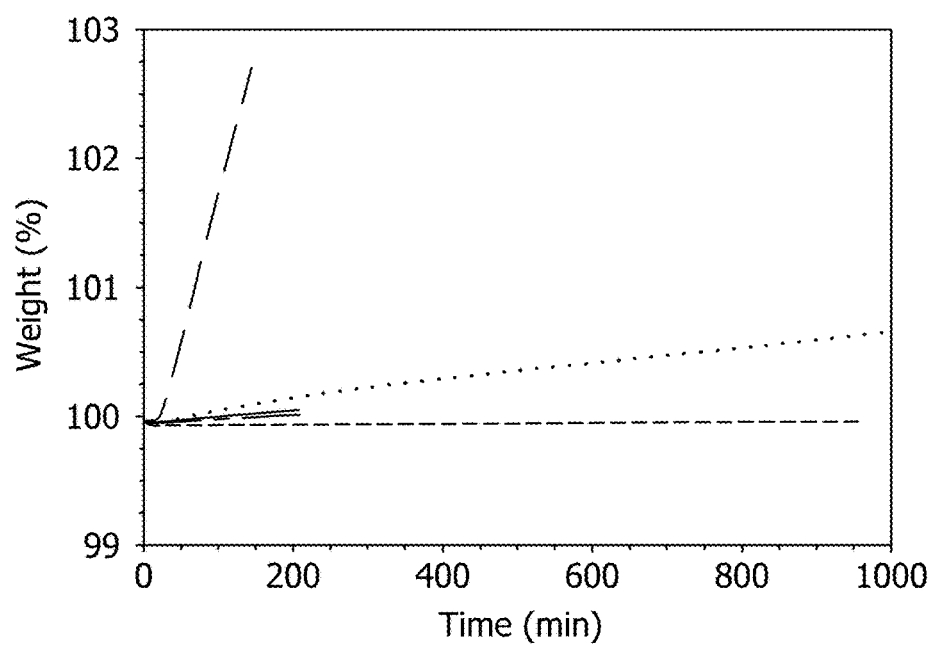
FIG. 6 is a TGA plot of percent weight vs. time. The temperature was held constant at 45° C. for the 18 hour duration of the test. The uncoated particles show a trace with a steep increase in mass. Traces for the coated samples are shown to the right of the uncoated sample with the best barrier coatings indistinguishable from the noisefloor of the measurement.
Figure 7:
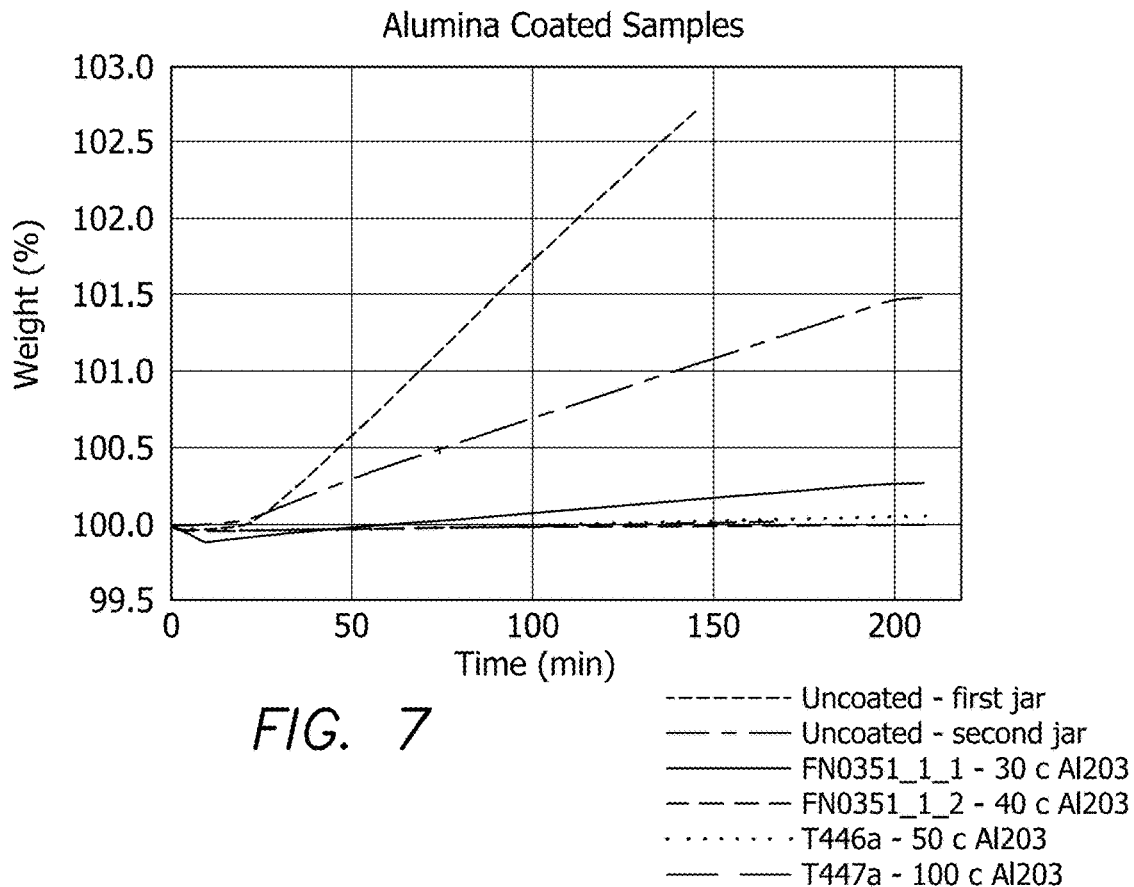
FIG. 7 is a TGA plot of percent weight vs. time for ALD alumina coated AlLi alloy particles. The dashed lines are the uncoated particles. The line showing 0.3 wt % increase is 30 ALD cycles while the three traces near the noisefloor correspond, in descending order of weight gain, to 50, 100 and 40 cycles.
Figure 8:
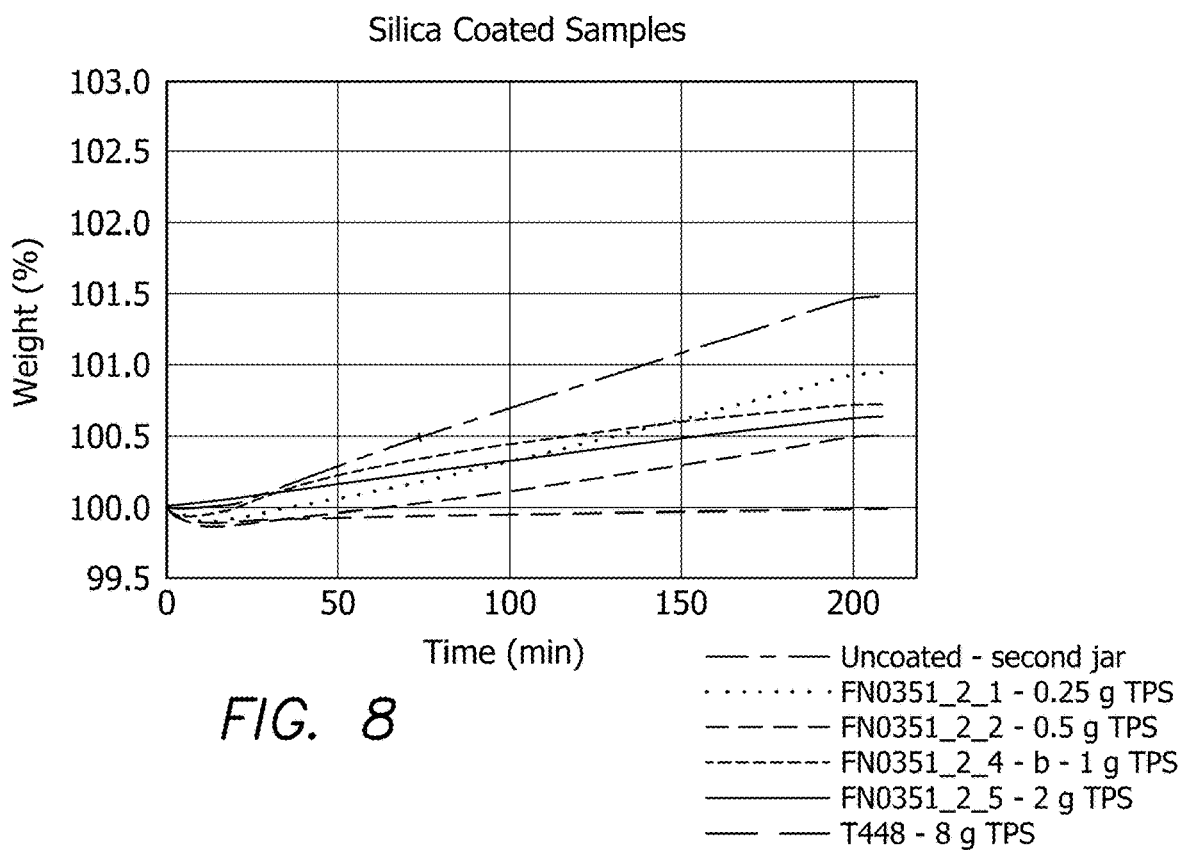
FIG. 8 is a TGA plot of percent weight vs. time for ALD silica coated AlLi alloy particles. With reference to weight gain at 200 minutes, the corresponding mass of absorbed precursor for a given mass of particles, in order of descending weight gain are: zero (uncoated), 0.25 g TPS, 1.0 g TPS, 2 g TPS, 0.5 g TPS, and 8 g TPS.
Figure 9:
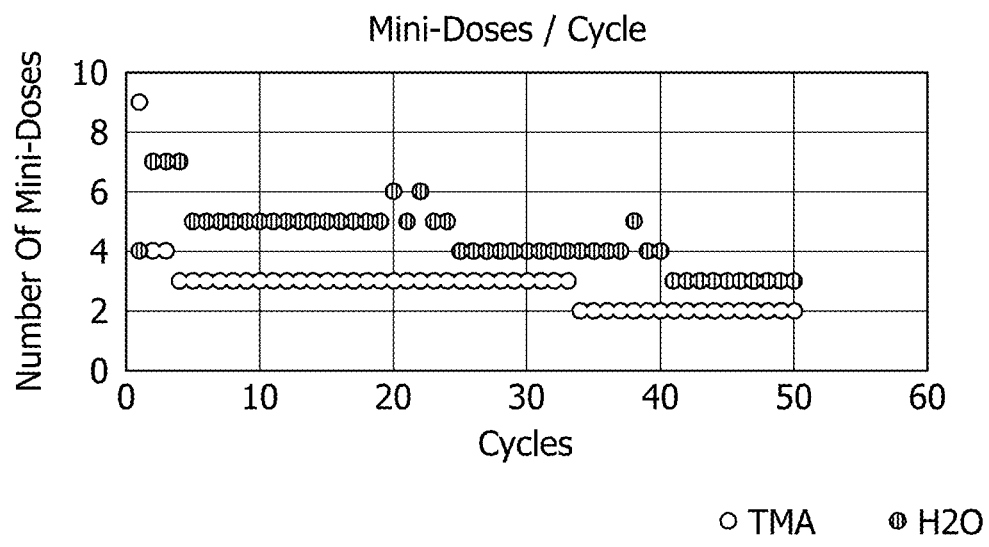
FIG. 9 is a plot of the number of mini-doses versus the number of cycles for each precursor trimethylaluminum (TMA) and water.
Figure 10:
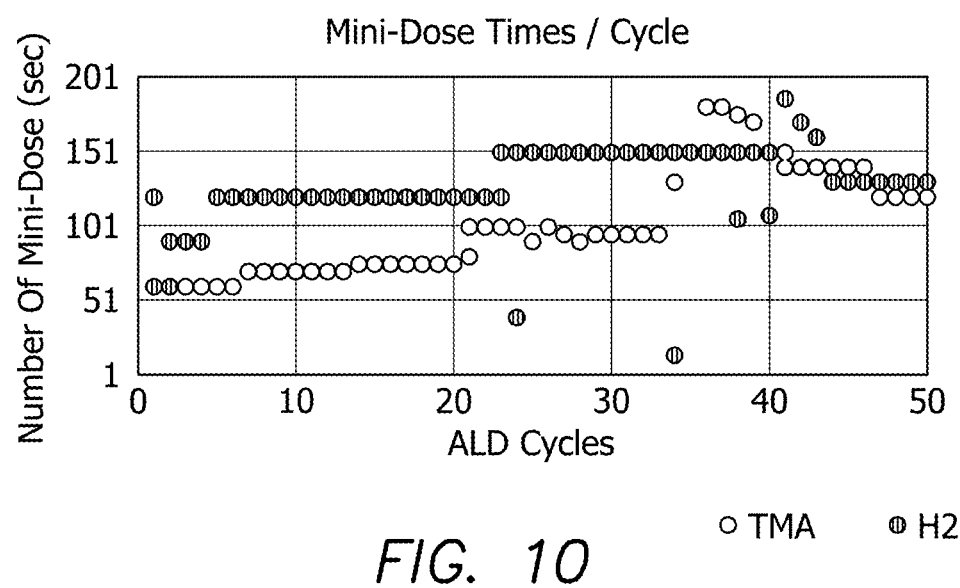
FIG. 10 is a plot of the duration of mini-doses versus the number of cycles for each precursor TMA and water.
Figure 11:
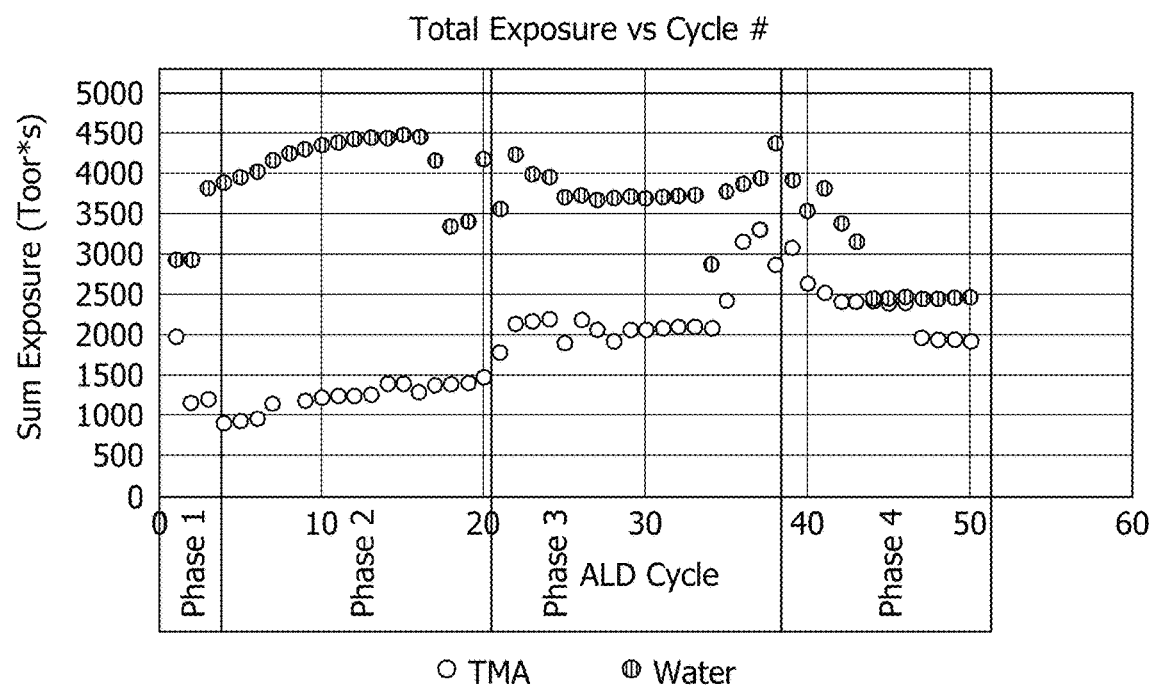
FIG. 11 is a plot of the total exposure (torr of precursor× time) versus the number of cycles for each precursor TMA and water. The cycles are shown as divided into four phases.

Method 1: Temperature Ramp with Humidity. Ramp 5° C./min to 350° C. Flow gas is Argon humidified by running the argon through water filled bubbler at 13° C. and 10 psig. Results are shown in FIG. 5. Method 2: Temperature Constant with Humidity. Hold the temperature consistently at 45° C. for 18 hours. Flow gas is Argon humidified by running the argon through water filled bubbler at 13° C. and 10 psig. Results are shown in FIG. 6.

Additional objects, advantages, and novel features of this invention will become apparent to those skilled in the art upon examination of the following examples thereof, which are not intended to be limiting.

EXAMPLES

Comparative Example 1: Baseline TMA/$H_2O$ Study on Group I (Hydrogen) containing energetic material powder. $Al_2O_3$ ALD was applied to an energetic material in a fluidized bed ALD reactor under standard deposition conditions taught by the prior art.

Comparative Example 2a: Baseline TMA/$H_2O$ Study on Group I (Lithium) containing energetic material powder. $Al_2O_3$ ALD was applied to a lithium-silicon energetic material in a fluidized bed ALD reactor under standard deposition conditions taught by the prior art. For this lithium-containing compound in the form of a lithium alloy, the ALD precursors underwent an adverse surface reaction with the substrate materials, and did not exhibit self-limiting growth at normal operating temperatures, pressures and exposure times.

Comparative Example 2b: Baseline TMA/$H_2O$ Study on Group I (Lithium) containing energetic material powder. $Al_2O_3$ ALD was applied to a lithium-aluminum energetic material in a fluidized bed ALD reactor under standard deposition conditions taught by the prior art. For this lithium-containing compound in the form of a lithium alloy, the ALD precursors underwent an adverse surface reaction with the substrate materials, and did not exhibit self-limiting growth at normal operating temperatures, pressures and exposure times.

Comparative Example 3: Baseline TMA/$H_2O$ Study on Group I (Sodium) containing energetic material powder. $Al_2O_3$ ALD was applied to a sodium-aluminum energetic material in a fluidized bed ALD reactor under standard deposition conditions taught by the prior art. For this sodium-containing compound in the form of a sodium alloy, the ALD precursors underwent an adverse surface reaction with the substrate materials, and did not exhibit self-limiting growth at normal operating temperatures, pressures and exposure times.

Comparative Example 4: Baseline TMA/$H_2O$ Study on Group II (Magnesium) containing energetic material powder. $Al_2O_3$ ALD was applied to a lithium-silicon energetic material in a fluidized bed ALD reactor under standard deposition conditions taught by the prior art. For this lithium-containing compound in the form of a lithium alloy, the ALD precursors underwent an adverse surface reaction with the substrate materials, and did not exhibit self-limiting growth at normal operating temperatures, pressures and exposure times, albeit not as extreme as what was observed for Group I alloy materials.

Examples Overview: In an effort to understand the limitations of performing alumina ALD with TMA/$H_2O$ and identify the causes of uncontrolled surface growth and some bulk sintering of the materials in Comparative Examples 2a, 2b, 3 and 4, the powder of each respective Comparative Example was processed in a miniature reactor on a fluidized bed ALD apparatus. Methods include low-temperature chemistry, ranging from room temperature to temperatures up to about 100° C., deposition of seed and/or interlayers to provide a buffer between substrate and coating materials, tuning the number of sub-cycles within each cycle varying by deposited cation or anion as a means to tailor final coating compositions, and altering methods specific to each Group I or Group II metal containing alloy material suitable for use as an energetic material. During room temperature tests, fluidization was visually monitored through a glass Conflat nipple to characterize physical aggregation phenomena. Pressures monitored during the runs to watch for indications of plugging or solidification of the powder.

Example 1: TMA/$H_2O$ Study on Spheroidized Group I and II Alloy Powders In an effort to understand the limitations of performing alumina ALD with TMA/$H_2O$ and identify the causes of bulk sintering of the various powders seen during processing of the Comparative Examples in fluidized bed ALD reactors, 20 g batches of spheroidized powder were processed in a miniature reactor on a fluidized bed ALD apparatus. Chemistry was performed at room temperature, 60° C. and 100° C. During room temperature tests, fluidization was visually monitored through a glass Conflat nipple. Pressures monitored during the runs to watch for indications of plugging or solidification of the powder. By monitoring the mass spec products, a target exposure time corresponding to full surface 'saturation' was programmed for the TMA and water, and triangulated with surface area-inspired calculations. By keeping timing near saturation, 50 cycles of $Al_2O_3$ ALD was performed at both room and elevated temperatures such that the powder substrate appeared to maintain its form and flowability after ALD. When the dose times for TMA and $H_2O$ were increased at 100° C., it was discovered after unloading that each powder had at least partially solidified into a solid mass at some time during the experiment.

All experiments were performed at a batch size of about 20 g in a miniature fluidized bed reactor (2.5 cm diameter) on a fluidized bed ALD apparatus. Bellows valves were installed at the inlet and outlet of the reactor so that pristine sphericized LiAl powder could be loaded and transferred to the fluidized bed ALD apparatus under inert atmosphere. The system was purged of air before exposing the powder to nitrogen flow for fluidization. Reaction byproducts were monitored using a mass spectrometer at the reactor outlet. TMA and $H_2O$ were both set to a temperature of 40° C., and the needle valves were set to 5 and 10, respectively. For the first experiment, a miniature reactor was set up with a short glass nipple at the bottom so that fluidization could be monitored during the run. Fluidization was observed at 10 sccm of nitrogen flow. To avoid overdosing during the first dose, short doses of about thirty seconds of TMA were performed six times (six sub-cycle exposures). Each time, mass 16 was observed on the mass spec, which is typical of $CH_4$ generation during TMA and water reactions. No TMA breakthrough was seen on mass 57 (or 72), and three total minutes of TMA exposure were calculated to be sufficient for saturation based on the total surface area of the batch.

On the first water dose, four thirty second doses (four sub-cycle exposures) were performed. During these water doses, no peak was observed on the mass spec for mass 16. Also, no water breakthrough was observed. Because of this irregularity, the mass spec was switched to histogram mode for the second cycle so other potential products could be monitored.

On the second cycle, TMA was dosed for a total of seven minutes (using sub-cycle exposure methods) without any signs of breakthrough. Again, methane was seen being produced. During the second water dose, methane generation was observed through mass 16. After an initial large spike of methane, the concentration dropped to a shoulder for two minutes at the same time hydrogen (mass 2) was observed. After, methane generation dropped to nearly zero and the water signal broke through and hydrogen continued to be generated at high concentrations. The hydrogen generation was hypothesized to be from water reacting with lithium in the bulk powder, producing hydrogen and lithium hydroxide, which was unexpected based upon the teachings of George. This reaction did not take place until the surface TMA was fully reacted and water was able to diffuse/migrate into the powder grain to react with subsurface lithium.

On the third cycle through the 50th cycle, dose times of 180 seconds were used for TMA and 110 seconds were used for water. A typical dose profile is shown in the figures. In each cycle, the methane generation during each subsequent water dose dropped and then leveled off, as seen in the figures. During the 49th cycle, the manifold pressure rose to about 40 Torr, indicating some sort of plug in a filter or other restriction of flow. Since the powder was observed to be free flowing upon unloading, it's possible that the filters became increasingly clogged with entrained powder over the course of the days-long run, and the powder receiving the same precursor treatments from excess reactant exposure was able to uptake excess coating materials and potentially allowed deposition to occur.

Example 2: Since TMA and $H_2O$ $Al_2O_3$ ALD was successfully performed using sub-cycle exposure techniques and at room temperature, with small precursor flow rates and short, 'just saturated' dose times, the same test was performed at an elevated reactor temperature of 100° C. to mimic conditions that lead to problems during previous trials as described in the Comparative Examples. The miniature fluidization reactor was loaded without the glass Conflat nipple viewing section so that the reactor could be heat taped and insulated with the isolation valves. Again, a large amount of hydrogen was generated during the first water dose. Over time, hydrogen generation per cycle dropped during subsequent cycles. Unlike FN0271.12-1, which had the same dose timing at room temperature, this elevated temperature run did not see water breakthrough during any of the cycles. Also, after about 8 cycles, hydrogen began to be generated during the second half of the TMA cycle. This was not observed in the room temperature test.

Again, the powder was unloaded after 50 cycles and maintained its flowability and powder characteristics. No appreciable pressure rise was seen in this experiment, which may mean that the filters did not clog in the same way as the previous experiment which was performed over a longer overall time period.

To try and purposefully sinter the powder into a solid mass like what was seen during Comparative Example operations, an experiment was performed at 60° C. and 100° C. with longer dose times. Also, the sample was exposed to water before TMA/water cycling took place. Most notably, these water cycles were long enough to see breakthrough in the early cycles, which was not the case for Example 1. While no obvious signs of plugging were observed in the pressures during the run, the powder was found to be a solid clump upon unloading. This may indicate that prolonged periods of overdosing lead to sintering of Group I and Group II metal alloy energetic material powders into solid masses. This again runs counter to the teachings of the prior art.

It was shown that successful TMA/$H_2O$ chemistry can be performed on Group I and Group II metal alloy powders from room temperature to elevated temperatures of up to 100° C. if care is taken not to overdose the sample. It was necessary for the inventors to develop new methods of applying ALD coatings onto energetic materials in order to promote triggerable release phenomena described above. Prolonged dosing times on Group I metal alloy powders at 100° C. and higher, and Group II metal alloy powders at 120° C. led to sintering of the powder into increasingly densified solid clumps. Hydrogen generation was observed during water doses, which was an indicator of completion of the TMA/water reaction on the surface, as subsequent signals correspond to water migration into the bulk that reacts with Group I and Group II metal alloy powders, or Group I and Group II metal interdiffusion away from the bulk and to the surface that reacts with water.

In some embodiments, developed ALD methods include performing uniform deposition processes comprising sub-cycle exposures at temperatures ranging from room temperature to 100° C., with prolonged dosing times to determine the threshold sintering temperature of the particles begins. Also, leveraging mass spectrometry data (or analogous in-situ technique) to monitor signal generation of reactants, products and unexpected intermediate byproducts during the array of temperature tests, as a means of refining dosing techniques for highly-energetic materials. Examples of unexpected intermediate byproducts include hydrogen generated at higher concentrations during later doses while hydrogen generation during the water dose decreases over time.

Sample #FN0271.12-1: $Al_2O_3$ ALD Test to see if fluidization changes after 'just saturated' $TMA/H_2O$ doses. Reaction run at 25° C.; TMA 40° C., orifice 5 μm; 180 sec dose, 360 sec purge; $H_2O$ 40° C., orifice@10 μm; 110 sec dose, 600 sec purge. Mass spectroscopy showed no methane generation during the water does on the first cycle at room temperature.

Sample #FN0271.12-2: $Al_2O_3$ ALD at 100° C. reactor temperature $TMA/H_2O$ doses. Reaction run at 100° C.; TMA 40° C., orifice 5 μm; 180 sec dose, 360 sec purge $H_2O$ 40° C., orifice@10 μm; 110 sec dose, 600 sec purge.

Sample #FN0271.12-3: $Al_2O_3$ ALD 100° C. reactor long doses. $TMA/H_2O$ doses. Reaction run at 100° C. TMA 40° C., orifice 5 μm; 180 sec dose, 360 sec purge; $H_2O$ 40° C., orifice@10 μm; 110 sec dose, 600 sec purge.

Sample #FN0260.19-1: Rapid $SiO_2$3 cycles of rapid $SiO_2$ on Li/Al alloy spherical powder.

Pre-Deposition
  Heated reaction chamber to 100° C., w/25 sccm $N_2$ flow for 20 min.
  Heated Vaporizer (SB) to 150° C. w/25 sccm $N_2$ flowing through, to bypass; for 20 min.
  Reduced Vaporizer temp. to 125° C., stopped $N_2$ flow through vaporizer.
  Increased reaction chamber temperature to 125° C.

Process Conditions
  reactor setpoint 100° C.
  Vaporizer with TPS set to 125° C.
  TMA set to 45° C., and manifold line (TIC-111) set to 80° C.
  $H_2O$ left at Room Temp. (~29° C.).
  $N_2$ flow set to 25 sccm during TMA dose, purge, and $H_2O$ dose.
  $N_2$ flow set to 50 sccm during Tris(tert-pentoxy)silanol (TPS) dose.
  Deposition/Process Notes: First TMA dose took 25 min.; following four TMA doses were set to 15 min. each. Vaporizer internal temperature was ~128° C. during TPS dosing.

The foregoing discussion of the invention has been presented for purposes of illustration and description and is not intended to limit the invention to the form or forms disclosed herein. All references cited herein are incorporated by reference in their entirety.

What is claimed is:

1. A method for applying a coating to a highly-energetic powder material comprising at least one Group I or Group II element, comprising:
   a) providing a volume of powder having a surface area to a reactor chamber, providing a total volume of first reagent and a total volume of second reagent, wherein the total volume of first reagent and total volume of second reagent are sufficient to saturate 100% to 150% of the surface area of said volume of powder;
   b) bringing the reactor chamber to a temperature between 25° C. and 100° C.;
   c) exposing the volume of powder to between 12.5% and 50% of the total volume of first reagent over a first time period;
   d) flushing or purging the reactor chamber over a second time period that is between 20% and 400% of the first time period;
   e) repeating steps (c) and (d) until the total volume of first reagent is exposed to the volume of powder;
   f) exposing the volume of powder to between 12.5% and 50% of the total volume of second reagent over a third time period;
   g) flushing or purging the reactor chamber over a fourth time period that is between 20% and 400% of the third time period;
   h) repeating steps (f) and (g) until the total volume of second reagent is exposed to the volume of powder.

2. The method of claim 1 wherein the first reagent comprises one or more of aluminum sec-butoxide, aluminum tribromide, aluminum trichloride, diethylaluminum ethoxide, dimethylaluminum isopropoxide, tris(ethylmethylamido)aluminum, tris(dimethylamido)aluminum, triethylaluminum, triisobutylaluminum, trimethylaluminum, tris(diethylamido)aluminum, tris(ethylmethylamido)aluminum, trimethylantimony(III), triethylantimony(III), triphenylantimony(III), tris(dimethylamido)antimony(III), trimethylarsine, triphenylarsine, triphenylarsine oxide, barium bis(2,2,6,6-tetramethyl-3,5-heptanedionate) hydrate, barium nitrate, bis(pentamethylcyclopentadienyl)barium tetrahydrofuran, bis(triisopropylcyclopentadienyl)barium tetrahydrofuran, bis(acetate-O)triphenylbismuth(V), triphenylbismuth, tris(2-methoxyphenyl)bismuthine, diborane, trimethylboron, triethylboron, triisopropylboroate, triphenylborane, tris(pentafluorophenyl)borane, cadmium acetylacetonate, calcium bis(2,2,6,6-tetramethyl-3,5-heptanedionate), carbon tetrabromide, carbon tetrachloride, cerium(III) trifluoroacetylacetonate, tetrakis(2,2,6,6-tetramethyl-3,5-heptanedionat)cerium(IV), tris(cyclopentadienyl)cerium(III), tris(isopropylcyclopentadienyl)cerium(III), tris(1,2,3,4-tetramethyl-2,4-cyclopentadienyl)cerium(III), bis(cyclopentadienyl)chromium(II), bis(pentamethylcyclopentadienyl)chromium(II), chromium(III) tris(2,2,6,6-tetramethyl-3,5-heptanedionate), chromium(II) chloride, chromium(III) chloride, chromium(II) carbonyl, chromium(III) carbonyl, cyclopentadienyl(II) chromium carbonyl, bis(cyclopentadienyl)cobalt(II), bis(ethylcyclopentadienyl)cobalt(II), bis(pentamethylcyclopentadienyl)cobalt(II), tribis(N,N'-diisopropylacetaminato)cobalt(II), dicarbonyl(cyclopentadienyl)cobalt(III), cyclopentadienylcobalt(II) carbonyl, copper bis(6,6,7,7,8,8,8-heptafluoro-2,2-dimethyl-3,5-octanedionate, copper bis(2,2,6,6-tetramethyl-3,5-heptanedionate, (N,N'-diisopropylacetaminato)copper(II), tris(2,2,6,6-tetramethyl-3,5-heptanedionato)dysprosium(III), tris(isopropylcyclopentadienyl)dysprosium(III), erbium(III) tris(2,2,6,6-tetramethyl-3,5-heptanedionate), tris(butylcyclopentadienyl)erbium(III), tris(N,N-bis(trimethylsilyl)amide)europium(III), tris(tetramethylcyclopentadienyl)europium(III), nitrogen trifluoride, tris(N,N-bis(trimethylsilyl)amide)gadolinium(III), tris(cyclopentadienyl)gadolinium(III), tris(tetramethylcyclopentadienyl)gadolinium(III), gallium tribromide, gallium trichloride, triethylgallium, triisopropylgallium, trimethylgallium, tris(dimethylamido)gallium, tri-tert-butylgallium, digermane, germane, tetramethylgermanium, germanium(IV) fluoride, germanium(IV) chloride, hexaethyldigermanium(IV), hexaphenyldigermanium(IV), tributylgermanium hydride, triphenylgermanium hydride, dimethyl(acetylacetonate)gold(III), dimethyl(trifluoroacetylacetonate)gold(III), hafnium (IV) chloride, hafnium (IV) tert-butoxide, tetrakis(diethylamido)hafnium (IV), tetrakis(dimethylamido)hafnium (IV), tetrakis(ethylmethylamido)hafnium (IV), bis(tert-butylcyclopentadienyl)dimethylhafnium(IV), bis(methyl-n-cyclopentadienyl)dimethylhafnium, bis(trimethylsilyl)amidohafnium(IV)

chloride, dimethylbis(cyclopentadienyl)hafnium(IV), hafnium isopropoxide, tris(N,N-bis(trimethylsilyl)amide)holmium(III), indium trichloride, indium(I) iodide, indium acetylacetonate, triethylindium, tris(dimethylamido)indium, tris(diethylamido)indium, tris(cyclopentadienyl)indium, 1,5-cyclooctadiene(acetylacetonato)iridium(I), 1,5-cyclooctadiene(hexafluoroacetylacetonato)iridium(I), 1-ethylcyclopentadienyl-1,3-cyclohexadieneiridium(I), (methylcyclopentadienyl)(1,5-cyclooctadiene)iridium(I), bi s(N,N'-di-tert-butylacetamidinato)iron (II), bis(pentamethylcyclopentadienyl)iron(II), ferrocene, 1,1'-diethylferrocene, iron pentacarbonyl, iron(III tris(2,2,6,6-tetramethyl-3,5-heptanedionate), tris(N,N'-Di-tert-butylacetamidinato)lanthanum (III), lanthanum(III) isopropoxide, tris(N,N-bis(trimethylsilyl)amide)lanthanum (III), tris(cyclopentadienyl)lanthanum(III), tris(tetramethylcyclopentadienyl)lanthanum(III), tetraethyllead, tetramethyllead, tetraphenyllead, tithium t-butoxide, lithium trimethylsilylamide, lithium (2,2,6,6-tetramethyl-3,5-heptanedionate), tris(N,N-diisopropylacetamidinato)lutetium (III), lutetium(III) tris(2,2,6,6-tetramethyl-3,5-heptanedionate), bis(cyclopentadienyl)magnesium(II), bis(pentamethylcyclopentadienyl)magnesium(II), bis(pentaethylcyclopentadienyl)magnesium(II), bis(cyclopentadienyl)manganese(II), bis(N,N-diisopropylpentylamidinato)manganese(II), bis(ethylcyclopentadienyl)manganese(II), bis(pentamethylcyclopentadienyl)manganese(II), bis(isopropylcyclopentadienyl)manganese(II), cyclopentadienylmanganese tricarbonyl, manganese carbonyl, methylcyclopentadienylmanganese tricarbonyl, manganese tris(2,2,6,6-tetramethyl-3,5-heptanedionate), molybdenum hexacarbonyl, molybdenum (V) chloride, molybdenum (VI) fluoride, bis(cyclopentadienyl)molybdenum(IV) dichloride, cyclopentadienylmolybdenum(II) tricarbonyl, propylcyclopentadienylmolybdenum(I) tricarbonyl, tris(N,N-bis(trimethylsilyl)amide)neodymium(III), bis(methylcyclopentadienyl)nickel(II), allyl(cyclopentadienyl)nickel(II), bis(cyclopentadienyl)nickel(II), bis(ethylcyclopentadienyl) nickel(II), bis(triphenylphosphine)nickel(II) dichloride, nickel(II) bis(2,2,6,6-tetramethyl-3,5-heptanedionate), bis(cyclopentadienyl)niobium(IV) dichloride, niobium(V) chloride, niobium(V) isopropoxide, niobium(V) ethoxide, N,N-dimethylhydrazine, ammonia, hydrazine, ammonium fluoride, azidotrimethylsilane, triosmium dodecacarbonyl, allyl(cyclopentadienyl)palladium(II), palladium(II) hexafluoroacetylacetonate, bis(2,2,6,6-tetramethyl-3,5-heptanedionato)palladium(II), phosphine, tert-butylphosphine, tris(trimethylsilyl)phosphine, phosphorous oxychloride, triethylphosphate, trimethylphosphate, methylcyclopentadienyl(trimethyl)platinum (IV), chloroplatinic acid, praseodymium(III) hexafluoroacetylacetonate hydrate, dirhenium decacarbonyl, acetylacetonato(1,5-cyclooctadiene)rhodium (I), bis(ethylcyclopentadienyl)ruthenium (II), bis(cyclopentadienyl)ruthenium(II), bis(pentamethylcyclopentadienyl) ruthnenium(II), triruthenium dodecacarbonyl, tris(N,N-bis(trimethylsilyl)amide)samarium(III), tris(tetramethylcyclopentadienyl)samarium(III), tris(2,2,6,6-tetramethyl-3,5-heptanedionato)scandium(III), dimethyl selenide, diethyl selenide, 2,4,6,8-tetramethylcyclotetrasiloxane, dimethoxydimethylsilane, di silane, methyl silane, octamethylcyclotetrasiloxane, silane, tris(isopropoxy)silanol, tris(tert-butoxy)silanol, tris(tert-pentoxy)silanol, (3-aminopropyl)triethoxysilane, N-sec-butyl(trimethylsilyl) amine, chloropentamethyldisilane, hexamethyldisilazane, silicon(IV) chloride, silicon(IV) bromide, pentamethyldisilane, tetraethyl silane, N,N',N''-tri-tert-butylsilanetriamine, (2,2,6,6-tetramethyl-3,5-heptanedionato)silver(I), triethoxyphosphine(trifluoroacetylacetonate)silver(I), silver(I) triethylphosphine(6,6,7,7,8,8,8-heptafluoro-2,2-dimethyl-3,5-octanedionate), trimethylphosphine (hexafluoroacetylacetonato)silver(I), vinyltriethylsilane (hexafluoroacetylacetonato)silver(I), strontium tetramethylheptanedionate, pentakis(dimethylamido)tantalum(V), tantalum(V) chloride, tantalum(V) ethoxide, tantalum(V) fluoride, tris(ethylmethylamido)tert-butylimido)tantalum(V), tris(diethylamido)(tert-butylimido)tantalum(V), tellurium tetrabromide, tellurium tetrachloride, terbium(2,2,6,6-tetramethyl-3,5-heptanedionate), tris(cyclopentadienyl) terbium(III), tris(tetramethylcyclopentadienyl)terbium(III), thallium(I) ethoxide, thallium(I) hexafluoroacetylacetonate, cyclopentadienylthallium, 2,2,6,6-tetramethyl-3,5-heptanedionatothallium(I), tris(N,N-bis(trimethylsilyl)amide)thulium(III), tris(cyclopentadienyl)thulium(III), tin(IV) chloride, tetramethyltin, tin(II) acetylacetonate, tin(IV) tert-butoxide, tin(II) hexafluoroacetylacetonate, bis(N,N'-diisopropylacetamidinato)tin(II), N,N-di-tert-butyl-2,3-diamidobutanetin(II), tetrakis(dimethylamino)tin(IV), bis(diethylamido)bis(dimethylamido)titanium (IV), tetrakis(diethylamido)titanium (IV), tetrakis(dimethylamido) titanium(IV), tetrakis(ethylmethylamido)titanium (IV), titanium (IV) bromide, titanium (IV) chloride, titanium (IV) fluoride, titanium (IV) tert-butoxide, titanium(IV) isopropoxide, titanium(IV) ethoxide, titanium(IV) methoxide, titanium(IV) isopropoxidebis(2,2,6,6-tetramethyl-3,5-heptanedionate), dichloro titanium(IV) oxide, bis(tert-butylimido) bis(dimethylamido)tungsten (VI), tungsten hexacarbonyl, tungsten (VI) chloride, tungsten (VI) fluoride, triaminetungsten(IV) tricarbonyl, cyclopentadienyltungsten(II) tricarbonyl hydride, bis(isopropylcyclopentadienyl)tungsten(IV) dihydride, bis(cyclopentadienyl)tungsten(IV) dihydride), bis(cyclopentadienyl)tungsten(IV) dichloride, bis(butylcyclopentadienyl)tungsten(IV) diiodide, bis(cyclopentadienyl) vanadium(II), vanadium(V) oxide trichloride, vanadium(V) oxytriisopropoxide, tris(N,N-bis(trimethylsilyl)amide)ytterbium(III), tris(cyclopentadienyl)ytterbium(III), tris(N,N-bis(trimethylsilyl)amide)yttrium (III), yttrium(III) tris(tert-butoxide), yttrium(III) triisopropoxide, yttrium(III) tris(2,2,6,6-tetramethyl-3,5-heptanedionate), tris(butylcyclopentadienyl)yttrium(III), tris(cyclopentadienyl) yttrium(III), yttrium 2-methoxyethoxide, diethylzinc, dimethylzinc, diphenylzinc, bis(2,2,6,6-tetramethyl-3,5-heptanedionate)zinc(II), bis(pentafluorophenyl)zinc, zirconium(IV) dibutoxide(bis-2,4-pentanedionate), zirconium (IV) 2-ethylhexanoate, zirconium tetrakis(2,2,6,6-tetramethyl-3,5-heptanedionate), bis(cyclopentadienyl) zirconium(IV) dihydride, bis(methyl-n-cyclopentadienyl) methoxymethylzirconium, tetrakis(diethylamido)zirconium (IV), dimethylbis(pentamethylcyclopentadienyl)zirconium (IV), tetrakis(dimethylamido)zirconium (IV), tetrakis(ethylmethylamido)zirconium (IV), zirconium (IV) bromide, zirconium (IV) chloride, zirconium (IV) tert-butoxide, and a mixture of any two or more thereof.

3. The method of claim 1 wherein the first reagent comprises one or more of a phosphide, a phosphate, a sulfide, a sulfate, a nitrate, a fluoride, a chloride, a bromide or an iodide.

4. The method of claim 1 wherein the powder comprises a metal or metal alloy.

5. The method of claim 1 wherein the powder comprises a lithium aluminum alloy or a lithium silicon alloy.

6. The method of claim 1 wherein the first reagent comprises one or more of aluminum sec-butoxide, aluminum tribromide, aluminum trichloride, diethylaluminum ethoxide, dimethylaluminum isopropoxide, tris(ethylmethylamido)aluminum, tris(dimethylamido)aluminum, triethylaluminum, triisobutylaluminum, trimethylaluminum, tris(diethylamido)aluminum, or tris(ethylmethyl-amido)aluminum.

7. The method of claim 1 wherein the first reagent comprises an aluminum-comprising precursor.

8. The method of claim 7 wherein the second reagent comprises phosphine, tert-butylphosphine, tris(trimethylsilyl)phosphine, phosphorous oxychloride, or triethylphosphate, trimethylphosphate.

\* \* \* \* \*